(12) United States Patent
Megretski et al.

(10) Patent No.: US 10,523,159 B2
(45) Date of Patent: Dec. 31, 2019

(54) DIGITAL COMPENSATOR FOR A NON-LINEAR SYSTEM

(71) Applicant: NanoSemi, Inc.

(72) Inventors: Alexandre Megretski, Concord, MA (US); Yan Li, Lexington, MA (US); Kevin Chuang, Cambridge, MA (US); Zohaib Mahmood, Ashland, MA (US); Helen H. Kim, Sudbury, MA (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 16/408,979

(22) Filed: May 10, 2019

(65) Prior Publication Data

US 2019/0348956 A1    Nov. 14, 2019

Related U.S. Application Data

(60) Provisional application No. 62/670,315, filed on May 11, 2018, provisional application No. 62/747,994, filed on Oct. 19, 2018.

(51) Int. Cl.
*H03F 1/32* (2006.01)
*H04B 1/04* (2006.01)

(52) U.S. Cl.
CPC ......... *H03F 1/3247* (2013.01); *H03F 1/3282* (2013.01); *H04B 1/04* (2013.01);
(Continued)

(58) Field of Classification Search
CPC ............... H03F 1/3247; H03F 1/3282; H03F 2201/3233; H04B 1/04; H04B 2001/0425
See application file for complete search history.

(56) References Cited

U.S. PATENT DOCUMENTS

| 4,979,126 A | 12/1990 | Pao et al. |
| 5,819,165 A | 10/1998 | Hulkko et al. |

(Continued)

FOREIGN PATENT DOCUMENTS

| EP | 1560329 | 8/2005 |
| WO | 20120154430 | 11/2012 |

(Continued)

OTHER PUBLICATIONS

Aguirre, et al., "On the Interpretation and Practice of Dynamical Differences Between Hammerstein and Wiener Models", IEEE Proceedings on Control Theory Appl; vol. 152, No. 4, Jul. 2005, pp. 349-356.

(Continued)

*Primary Examiner* — Nguyen T Vo
(74) *Attorney, Agent, or Firm* — Occhiuti & Rohlicek LLP

(57) ABSTRACT

A pre-distorter that both accurately compensates for the non-linearities of a radio frequency transmit chain, and that imposes as few computation requirements in terms of arithmetic operations, uses a diverse set of real-valued signals that are derived from the input signal. The derived real signals are passed through configurable non-linear transformations, which may be adapted during operation, and which may be efficiently, implemented using lookup tables. The outputs of the non-linear transformations serve as gain terms for a set of complex signals, which are functions of the input, and which are summed to compute the pre-distorted signal. A small set of the complex signals and derived real signals may be selected for a particular system to match the classes of non-linearities exhibited by the system, thereby providing further computational savings, and reducing complexity of adapting the pre-distortion through adapting of the non-linear transformations.

36 Claims, 7 Drawing Sheets

(52) U.S. Cl.
CPC ............... *H03F 2201/3233* (2013.01); *H04B 2001/0425* (2013.01)

(56) References Cited

U.S. PATENT DOCUMENTS

| | | |
|---|---|---|
| 5,980,457 A | 11/1999 | Averkiou |
| 6,052,412 A | 4/2000 | Ruether et al. |
| 6,240,278 B1 | 5/2001 | Midya et al. |
| 6,985,704 B2 | 1/2006 | Yang et al. |
| 7,149,257 B2 | 12/2006 | Braithwaite |
| 7,295,815 B1 | 11/2007 | Wright et al. |
| 7,342,976 B2 | 3/2008 | McCallister |
| 7,418,056 B2 | 8/2008 | Suzuki et al. |
| 7,469,491 B2 | 12/2008 | McCallister et al. |
| 7,529,652 B1 | 5/2009 | Gahinet et al. |
| 7,539,464 B2 | 5/2009 | Suzuki et al. |
| 7,561,857 B2 | 7/2009 | Singerl et al. |
| 7,577,211 B2 | 8/2009 | Braithwaite |
| 7,599,431 B1 | 10/2009 | Anderson et al. |
| 7,729,668 B2 | 6/2010 | Leffel |
| 7,904,033 B1 | 3/2011 | Wright et al. |
| 7,953,378 B2 | 5/2011 | Saed |
| 8,014,263 B2 | 9/2011 | Tao et al. |
| 8,030,997 B2 | 10/2011 | Brown et al. |
| 8,064,850 B2 | 11/2011 | Yang et al. |
| 8,185,066 B2 | 5/2012 | Camp, Jr. et al. |
| 8,203,386 B2 | 6/2012 | Van Der Heijden et al. |
| 8,290,086 B2 | 10/2012 | Bose et al. |
| 8,334,723 B2 | 12/2012 | Hongo |
| 8,368,466 B2 | 2/2013 | Bai |
| 8,390,376 B2 | 3/2013 | Bai |
| 8,412,132 B2 | 4/2013 | Tang et al. |
| 8,446,979 B1 | 5/2013 | Yee |
| 8,451,053 B2 | 5/2013 | Perreault et al. |
| 8,467,747 B2 | 6/2013 | Kim et al. |
| 8,489,047 B2 | 7/2013 | McCallister et al. |
| 8,519,789 B2 | 8/2013 | Hawkes |
| 8,537,041 B2 | 9/2013 | Chandrasekaran et al. |
| 8,576,941 B2 | 11/2013 | Bai et al. |
| 8,659,353 B2 | 2/2014 | Dawson et al. |
| 8,686,791 B2 | 4/2014 | Lozhkin |
| 8,711,976 B2 | 4/2014 | Chandrasekaran |
| 8,718,582 B2 | 5/2014 | See et al. |
| 8,731,005 B2 | 5/2014 | Schlee |
| 8,731,105 B2 | 5/2014 | Bai |
| 8,737,938 B2 | 5/2014 | Rashev et al. |
| 8,766,717 B2 | 7/2014 | Sorrells et al. |
| 8,787,494 B2 | 7/2014 | Bai |
| 8,817,859 B2 | 8/2014 | Ghannouchi et al. |
| 8,976,896 B2 | 3/2015 | McCallister et al. |
| 8,989,307 B2 | 3/2015 | Zhou et al. |
| 9,026,064 B2 | 5/2015 | Wang et al. |
| 9,130,628 B1 | 9/2015 | Mittal et al. |
| 9,184,710 B2 | 11/2015 | Braithwaite |
| 9,214,969 B2 | 12/2015 | Hammi |
| 9,215,120 B2 | 12/2015 | Rexberg et al. |
| 9,226,189 B1 | 12/2015 | Kularatna et al. |
| 9,252,821 B2 | 2/2016 | Shor et al. |
| 9,337,782 B1 | 5/2016 | Mauer et al. |
| 9,374,196 B2 | 6/2016 | Yang et al. |
| 9,450,621 B2 | 9/2016 | Xiong et al. |
| 9,590,567 B2 | 3/2017 | Zhao et al. |
| 9,590,668 B1 | 3/2017 | Kim et al. |
| 9,628,119 B2 | 4/2017 | Gal et al. |
| 9,660,593 B2 | 5/2017 | Abdelrahman et al. |
| 9,680,434 B2 | 6/2017 | Yan et al. |
| 9,893,748 B2 | 2/2018 | Ye et al. |
| 9,923,595 B2 | 3/2018 | Molina et al. |
| 9,973,370 B1 | 5/2018 | Langer et al. |
| 10,080,178 B2 | 9/2018 | Stapleton et al. |
| 10,141,896 B2 | 11/2018 | Huang |
| 10,148,230 B2 | 12/2018 | Xu et al. |
| 10,153,793 B2 | 12/2018 | Hausmair et al. |
| 10,224,970 B2 | 3/2019 | Pratt |
| 2002/0080891 A1 | 6/2002 | Ahn et al. |
| 2003/0184374 A1 | 10/2003 | Huang et al. |
| 2004/0076247 A1 | 4/2004 | Barak et al. |
| 2004/0116083 A1 | 6/2004 | Suzuki et al. |
| 2004/0142667 A1* | 7/2004 | Lochhead ............. H03F 1/3247 455/114.3 |
| 2006/0022751 A1 | 2/2006 | Fuller et al. |
| 2006/0154622 A1 | 7/2006 | Piirainen |
| 2006/0229036 A1 | 10/2006 | Muller et al. |
| 2007/0091992 A1 | 4/2007 | Dowling |
| 2007/0230557 A1 | 10/2007 | Balasubramonian et al. |
| 2008/0019453 A1 | 1/2008 | Zhao et al. |
| 2008/0039045 A1 | 2/2008 | Filipovic et al. |
| 2008/0101502 A1 | 5/2008 | Navidpour et al. |
| 2008/0247487 A1 | 10/2008 | Cai et al. |
| 2008/0285640 A1 | 11/2008 | McCallister et al. |
| 2010/0026354 A1 | 2/2010 | Utsunomiya et al. |
| 2011/0098011 A1 | 4/2011 | Camp, Jr. et al. |
| 2011/0128992 A1 | 6/2011 | Maeda et al. |
| 2011/0150130 A1 | 6/2011 | Kenington |
| 2011/0255627 A1 | 10/2011 | Gotman et al. |
| 2011/0273236 A1 | 11/2011 | Heijden et al. |
| 2012/0093210 A1 | 4/2012 | Schmidt et al. |
| 2012/0219048 A1 | 8/2012 | Camuffo et al. |
| 2013/0044791 A1 | 2/2013 | Rimini et al. |
| 2014/0161159 A1 | 6/2014 | Black et al. |
| 2014/0161207 A1 | 6/2014 | Teterwak |
| 2014/0177695 A1 | 6/2014 | Cha et al. |
| 2014/0274105 A1 | 9/2014 | Wang |
| 2014/0347126 A1 | 11/2014 | Laporte et al. |
| 2015/0043323 A1 | 2/2015 | Choi et al. |
| 2015/0049841 A1 | 2/2015 | Laporte et al. |
| 2015/0061761 A1 | 3/2015 | Wills et al. |
| 2015/0103952 A1 | 4/2015 | Wang et al. |
| 2015/0123735 A1 | 5/2015 | Wimpenny |
| 2015/0171768 A1 | 6/2015 | Perreault |
| 2015/0325913 A1 | 11/2015 | Vagman |
| 2015/0333781 A1 | 11/2015 | Alon et al. |
| 2016/0028433 A1 | 1/2016 | Ding et al. |
| 2016/0087604 A1 | 3/2016 | Kim et al. |
| 2016/0094253 A1 | 3/2016 | Weber et al. |
| 2016/0095110 A1 | 3/2016 | Li et al. |
| 2016/0100180 A1 | 4/2016 | Oh |
| 2016/0112222 A1 | 4/2016 | Pashay-Kojouri et al. |
| 2016/0191020 A1* | 6/2016 | Velazquez ......... H03H 21/0067 341/118 |
| 2016/0241277 A1 | 8/2016 | Rexberg et al. |
| 2016/0249300 A1 | 8/2016 | Tsai et al. |
| 2016/0285485 A1 | 9/2016 | Fehri et al. |
| 2016/0373072 A1 | 12/2016 | Magesacher et al. |
| 2017/0033969 A1 | 2/2017 | Yang et al. |
| 2017/0041124 A1 | 2/2017 | Khandani |
| 2017/0077981 A1 | 3/2017 | Tobisu et al. |
| 2017/0176507 A1 | 6/2017 | O'Keeffe et al. |
| 2017/0244582 A1 | 8/2017 | Gal et al. |
| 2018/0097530 A1 | 4/2018 | Yang et al. |
| 2018/0337700 A1 | 11/2018 | Huang et al. |
| 2019/0238204 A1 | 8/2019 | Kim et al. |
| 2019/0260401 A1 | 8/2019 | Megretski et al. |
| 2019/0260402 A1 | 8/2019 | Chuang et al. |

FOREIGN PATENT DOCUMENTS

| | | |
|---|---|---|
| WO | WO2018156932 A1 | 8/2018 |
| WO | WO2018227093 A1 | 12/2018 |
| WO | WO2018227111 A1 | 12/2018 |
| WO | WO2019014422 A1 | 1/2019 |
| WO | WO2019070573 A1 | 4/2019 |
| WO | WO2019094713 A1 | 5/2019 |
| WO | WO2019094720 A1 | 5/2019 |

OTHER PUBLICATIONS

Barradas, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.
Bosch et al. "Measurement and Simulation of Memory Effects in Predistortion Linearizers, " IEEE Transactions on Mircrowave Theory and Techniques; vol. 37. No. 12; Dec 1989, pp. 1885-1890.

(56) References Cited

OTHER PUBLICATIONS

Braithwaite, et al. "Closed-Loop Digital Predistortion (DPD) Using an Observation Path with Limited Bandwidth" IEEE Transactions on Microwave Theory and Techniques; vol. 63, No. 2; Feb. 2015, pp. 726-736.
Cavers, "Amplifier Linearization Using a Digital Predistorter with Fast Adaption and Low Memory Requirements;" IEEE Transactions on Vehicular Technology; vol. 39; No. 4; Nov. 1990, pp. 374-382.
D'Andrea et al., "Nonlinear Predistortion of OFDM Signals over Frequency-Selective Fading Channels," IEEE Transactions on Communications; vol. 49; No. 5, May 2001; pp. 837-843.
Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603.
Henrie, et al., "Cancellation of Passive Intermodulation Distortion in Microwave Networks", Proceedings of the 38th European Microwave Conference, Oct. 2008, Amsterdam, The Netherlands, pp. 1153-1156.
Hong et al., "Weighted Polynomial Digital Predistortion for Low Memory Effect Doherty Power Amplifier," IEEE Transactions on Microwave Theory and Techniques; vol. 55; No. 5, May 2007, pp. 925-931.
Kwan, et al., "Concurrent Multi-Band Envelope Modulated Power Amplifier Linearized Using Extended Phase-Aligned DPD", IEEE Transactions on Microwave Theory and Techniques; vol. 62, No. 12, Dec. 2014, pp. 3298-3308.
Lajoinie, et al. "Efficient Simulation of NPR for the Optimum Design of Satellite Transponders SSPAs", EEE MTT-S International; vol. 2; Jun. 1998; pp. 741-744.
Li et al. "High-Throughput Signal Component Separator for Asymmetric Multi-Level Outphasing Power Amplifiers", IEEE Journal of Solid-State Circuits; vol. 48; No. 2; Feb. 2013; pp. 369-380.
Liang, et al. "A Quadratic-Interpolated LUT-Based Digital Predistortion Techniques for Cellular Power Amplifiers", IEEE Transactions on Circuits and Systems; II: Express Briefs, vol. 61, No. 3, Mar. 2014; pp. 133-137.
Liu, et al. "Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.
Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.
Morgan, et al. "A Generalized Memory Polynomial Model for Digital Predistortion of RF Power Amplifiers", IEEE Transactions of Signal Processing; vol. 54; No. 10; Oct. 2006; pp. 3852-3860.
Naraharisetti, et a., "2D Cubic Spline Implementation for Concurrent Dual-Band System", IEEE, 2013, pp. 1-4.
Naraharisetti, et al. "Efficient Least-Squares 2-D-Cubic Spline for Concurrent Dual-Band Systems", IEEE Transactions on Microwave Theory and Techniques, vol. 63; No. 7, Jul. 2015; pp. 2199-2210.
Osamu Muta et al., "Adaptive predistortion linearization based on orthogonal polynomial expansion for nonlinear power amplifiers in OFDM systems", Communications and Signal Processing (ICCP), International Conference On, IEEE, pp. 512-516, 2011.
Panigada, et al. "A 130 mW 100 MS/s Pipelined ADC with 69 SNDR Enabled by Digital Harmonic Distortion Correction", IEEE Journal of Solid-State Circuits; vol. 44; No. 12; Dec. 2009, pp. 3314-3328.
Peng, et al. "Digital Predistortion for Power Amplifier Based on Sparse Bayesian Learning", IEEE Transactions on Circuits and Systems, II: Express Briefs; 2015, pp. 1-5.
Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61; No. 12, Dec. 2013, pp. 4591-4599.
Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 2010; pp. 95-104.
Safari, et al. "Spline-Based Model for Digital Predistortion of Wide-Band Signals for High Power Amplifier Linearization", IEEE; 2007, pp. 1441-1444.
Sevic, et al. "A Novel Envelope-Termination Load-Pull Method of ACPR Optimization of RF/Microwave Power Amplifiers", IEEE MTT-S International; vol. 2, Jun. 1998; pp. 723-726.
Tai, "Efficient Watt-Level Power Amplifiers in Deeply Scaled CMOS", Ph.D. Dissertation; Carnegie Mellon University; May 2011; 129 pages.
Tehrani, et al. "Modeling of Long Term Memory Effects in RF Power Amplifiers with Dynamic Parameters", IEEE; 2012, pp. 1-3.
Yu, et al. "A Generalized Model Based on Canonical Piecewise Linear Functions for Digital Predistortion", Proceedings of the Asia-Pacific Microwave Conference; 2016
Yu, et al. "Band-Limited Volterra Series-Based Digital Predistortion for Wideband RF Power Amplifiers", IEEE Transactions of Microwave Theory and Techniques; vol. 60; No. 12; Dec. 2012, pp. 4198-4208.
Yu, et al. "Digital Predistortion Using Adaptive Basis Functions", IEEE Transations on Circuits and Systems—I. Regular Papers; vol. 60, No. 12; Dec. 2013, pp. 3317-3327.
Zhang et al. "Linearity Performance of Outphasing Power Amplifier Systems," Design of Linear Outphasing Power Amplifiers; Google e-book; 2003; Retrieved on Jun. 13, 2014; Retrieved from internet http:www.artechhouse.com/uploads/public/documents/chapters/Zhang-Larson.
Zhu et al. "Digital Predistortion for Envelope-Tracking Power Amplifiers Using Decomposed Piecewise Volterra Sereis," IEEE Transactions on Microwave Theory and Techniques; vol. 56; No. 10; Oct. 2008; pp. 2237-2247.
Guan, Lei, and Anding Zhu. "Green communications: Digital predistortion for wideband RF power amplifiers." IEEE Microwave Magazine 15, No. 7 (2014): 84-99.
Zhu, Anding, Jos C. Pedro, and Thomas J. Brazil. "Dynamic deviation reduction-based Volterra behavioral modeling of RF power amplifiers." IEEE Transactions on microwave theory and techniques 54, No. 12 (2006): 4323-4332.
Zhu, Anding, Paul J. Draxler, Jonmei J. Yan, Thomas J. Brazil, Donald F. Kimball, and Peter M. Asbeck. "Open-loop digital predistorter for RF power amplifiers using dynamic deviation reduction-based Volterra series." IEEE Transactions on Microwave Theory and Techniques 56, No. 7 (2008): 1524-1534.
Cao, Haiying, Hossein Mashad Nemati, Ali Soltani Tehrani, Thomas Eriksson, and Christian Fager. "Digital predistortion for high efficiency power amplifier architectures using a dual-input modeling approach." IEEE Transactions on Microwave Theory and Techniques 60, No. 2 (2012): 361-369.
Naraharisetti, Naveen. "Linearization of Concurrent Dual-Band Power Amplifier Using Digital Predistortion." PhD diss., The Ohio State University, 2014.
Tehrani, Ali Soltani. Behavioral modeling of radio frequency transmitters. Chalmers University of Technology, 2009.
PCT International Search Report, PCT/US2019/031714, dated Aug. 13, 2019, 15 pgs.

\* cited by examiner

DIGITAL COMPENSATOR FOR A NON-LINEAR SYSTEM

CROSS-REFERENCE TO RELATED APPLICATIONS

This application claims the benefit of U.S. Provisional Application No. 62/670,315, filed on May 11, 2018, and U.S. Provisional Application No. 62/747,994, filed Oct. 19, 2018, each of which is incorporated herein by reference.

BACKGROUND

This invention relates to digital compensation of a non-linear circuit or system, for instance linearizing a non-linear power amplifier and radio transmitter chain, and in particular to effective parameterization of a digital pre-distorter used for digital compensation.

One method for compensation of such a non-linear circuit is to "pre-distort" (or "pre-invert") the input. For example, an ideal circuit outputs a desired signal u[.] unchanged, such that y[.]=, while the actual non-linear circuit has an input-output transformation y[.]=F(u[.]), where the notation y[.] denotes a discrete time signal. A compensation component is introduced before the non-linear circuit that transforms the input u[.] which represents the desired output, to a predistorted input v[.] according to a transformation v[.]=C(u[.]). Then this predistorted input is passed through the non-linear circuit, yielding y[.]F(v[.]). The functional form and selectable parameters values that specify the transformation C( ) are chosen such that y[.]≈u[.] as closely as possible in a particular sense (e.g., minimizing mean squared error), thereby linearizing the operation of tandem arrangement of the pre-distorter and the non-linear circuit as well as possible.

In some examples, the DPI) performs the transformation of the desired signal u[.] to the input y[.] by using delay elements to form a set of delayed versions of the desired signal, and then using a non-linear polynomial function of those delayed inputs. In some examples, the non-linear function is a Volterra series:

$$y[n]=x_0+\Sigma_p\Sigma_{\tau_1,\ldots,\tau_p}x_p(\tau_1,\ldots,\tau_p)\Pi_{j=1\ldots p}u[n-\tau_j]$$

or $$y[n]=x_0+\Sigma_p\Sigma_{\tau_1,\ldots,\tau_{2p-1}}x_p(\tau_1,\ldots,\tau_p)\Pi_{j=1\ldots p}u[n-\tau_j]\Pi_{j=p+1\ldots 2p-1}u[n-\tau_j]^*$$

In some examples, the non-linear function uses a reduced set of Volterra terms or a delay polynomial:

$$y[n]=x_0+\Sigma_p\Sigma_\tau x_p(\tau)u[n-\tau]|u[n-\tau]|^{(p-1)}.$$

In these cases, the particular compensation function C is determined by the values of the numerical configuration parameters $x_p$.

In the case of a radio transmitter, the desired input u[.] may be a complex discrete time baseband signal of a transmit band, and y[.] may represent that transmit band as modulated to the carrier frequency of the radio transmitter by the function F( ) that represents the radio transmit chain. That is, the radio transmitter may modulate and amplify the input v[.] to a (real continuous-time) radio frequency signal p(.) which when demodulated back to baseband, limited to the transmit band and sampled, is represented by y[.].

There is a need for a pre-distorter with a form that both accurately compensates for the non-linearities of the transmit chain, and that imposes as few computation requirements in terms of arithmetic operations to be performed to pre-distort a signal and in terms of the storage requirements of values of the configuration parameters. There is also a need for the form of the pre-distorter to be robust to variation in the parameter values and/or to variation of the characteristics of the transmit chain so that performance degradation of pre-distortion does not exceed that which may be commensurate with the degree of such variation.

SUMMARY

In one aspect, in general, a pre-distorter that both accurately compensates for the non-linearities of a radio frequency transmit chain, and that imposes as few computation requirements in terms of arithmetic operations and storage requirements, uses a diverse set of real-valued signals that are derived from the input signal, as well as optional input envelope and other relevant measurements of the system. The derived real signals are passed through configurable non-linear transformations, which may be adapted during operation based on sensed output of the transmit chain, and which may be efficiently implemented using lookup tables. The outputs of the non-linear transformations serve as gain terms for a set of complex signals, which are transformations of the input. The gain-adjusted complex signals are summed to compute the pre-distorted signal, which is passed to the transmit chain. A small set of the complex signals and derived real signals may be selected for a particular system to match the non-linearities exhibited by the system, thereby providing further computational savings, and reducing complexity of adapting the pre-distortion through adapting of the non-linear transformations.

In another aspect, in general, a method of signal predistortion linearizes a non-linear circuit. An input signal (u) is processed to produce multiple transformed signals (w). The transformed signals are processed to produce multiple phase-invariant derived signals (r). These phase-invariant derived signals (r) are determined such that each derived signal ($r_j$) is equal to a non-linear function of one or more of the transformed signals. The derived signals are phase-invariant in the sense that a change in the phase of a transformed signal does not change the value of the derive signal. At least some of the derived signals are equal to functions of different one or more of the transformed signals. Each derived signal ($r_j$) of the phase-invariant derived signals is processed according to a parametric non-linear transformation to produce a time-varying gain component ($g_i$) of multiple gain components (g). A distortion term is then formed by accumulating multiple terms. Each term is a product of a transformed signal of the transformed signals and a time-varying gain. The time-varying gain is a function (Φ) of one or more of the phase-invariant derived signals (i.e., a gain signal determined from the derived signals) and the function of the one or more of the phase-invariant derived signals is decomposable into a combination of one or more parametric functions (φ) of a corresponding single one of thephase invariant derived signals ($r_j$) yielding a corresponding one of the time-varying gain components (i.e., component gain signals). An output signal (v) is determined from the distortion term and provided for application to the non-linear circuit.

Aspects may include one or more of the following features.

The non-linear circuit includes a radio-frequency section including a radio-frequency modulator configured to modulate the output signal to a carrier frequency to form a modulated signal and an amplifier for amplifying the modulated signal.

The input signal (u) includes quadrature components of a baseband signal for transmission via the radio-frequency section.

The input signal (u) and the transformed signals (w) are complex-valued signals.

Processing the input signal (u) to produce the transformed signals (w) includes forming at least one of the transformed signals as a linear combination of the input signal (u) and one or more delayed versions of the input signal.

At least one of the transformed signals is formed as a linear combination includes forming a linear combination with at least one imaginary or complex multiple input signal or a delayed version of the input signal.

Forming at least one of the transformed signals, $w_k$ to be a multiple of $D_\alpha w_a + j^d w_b$, where $w_a$ and $w_b$ are other of the transformed signals, and $D_\alpha$ represents a delay by $\alpha$, and d is an integer between 0 and 3.

Forming the at least one of the transformed signals includes time filtering the input signal to form said transformed signal. The time filtering of the input signal can include includes applying a finite-impulse-response (FIR) filter to the input signal, or applying an infinite-impulse-response (HR) filter to the input signal.

The transformed signals (w) include non-linear functions of the input signal (u).

The non-linear functions of the input signal (u) include at least one function of a form $u[n-\tau]|u[n-\tau]|^p$ for a delay r and an integer power p or $\Pi_{j=1 \ldots p} u[n-\tau_j] \Pi_{j=p+1 \ldots 2p-1} u[n-\tau_j]^*$ for a set for integer delays $\tau_1$ to $\tau_{2p-1}$, where * indicates a complex conjugate operation.

Determining a plurality of phase-invariant derived signals (r) comprises determining real-valued derived signals.

Determining the phase-invariant derived signals (r) comprises processing the transformed signals (w) to produce a plurality of phase-invariant derived signals r.

Each of the derived signals is equal to a function of a single one of the transformed signals.

Processing the transformed signals (w) to produce the phase-invariant derived signals includes, for at least one derived signal ($r_p$), computing said derived signal by first computing a phase-invariant non-linear function of one of the transformed signals ($w_k$) to produce a first derived signal, and then computing a linear combination of the first derived signal and delayed versions of the first derived signal to determine the at least one derived signal.

Computing a phase-invariant non-linear function of one of the transformed signals ($w_k$) comprises computing a power of a magnitude of the one of the transformed signals ($|w_k|^p$) for an integer power $p \geq 1$. For example, p=1 or p=2.

Computing the linear combination of the first derived signal and delayed versions of the first derived signal comprises time filtering the first derived signal. Time filtering the first derived signal can include applying a finite-impulse-response (FIR) filter to the first derived signal or applying an infinite-impulse-response (IIR) filter to the first derived signal.

Processing the transformed signals (w) to produce the phase-invariant derived signals includes computing a first signal as a phase-invariant non-linear function of a first signal of the transformed signals, and computing a second signal as a phase-invariant non-linear function of a second signal of the transformed signals, and then computing a combination of the first signal and the second signal to form at least one of the phase-invariant derived signals.

At least one of the phase-invariant derived signals is equal to a function for two of the transformed signals $w_a$ and $w_b$ with a form $|w_a[t]|^\alpha |w_b[t-\tau]|^\beta$ for positive integer powers $\alpha$ and $\beta$.

The transformed signals (w) are processed to produce the phase-invariant derived signals by computing a derived signal $r_k[t]$ using at least one of the following transformations:

$$r_k[t] = |w_a[t]|^\alpha,$$

where $\alpha > 0$ for a transformed signal $w_a[t]$;

$$r_k[t] = 0.5(1 - \theta + r_a[t-\alpha] + \theta r_b[t]),$$

where $\theta \in \{1, -1\}$, $a, b \in \{1, \ldots, k-1\}$, and $\alpha$ is an integer and $r_a[t]$ and $r_b[t]$ are other of the derived signals;

$$r_k[t] = r_a[t-\alpha] r_b[t],$$

where $a, b \in \{1, \ldots, k-1\}$ and $\alpha$ is an integer and $r_a[t]$ and $r_b[t]$ are other of the derived signals; and $$r_k[t] = r_k[t-1] + 2^{-d}(r_a[t] - r_k[t-1]),$$

where $a \in \{1, \ldots, k-1\}$ and d is an integer $d > 0$.

The time-varying gain components comprise complex-valued gain components.

The method includes transforming a first derived signal ($r_j$) of the plurality of phase-invariant derived signals according to one or more different parametric non-linear transformation to produce a corresponding time-varying gain components.

The one or more different parametric non-linear transformations comprises multiple different non-linear transformations producing corresponding time-varying gain components.

Each of the corresponding time-varying gain components forms a part of a different term of the plurality of terms of the sum forming the distortion term.

Forming the distortion term comprises forming a first sum of products, each term in the first sum being a product of a delayed version of the transformed signal and a second sum of a corresponding subset of the gain components.

The distortion term $\delta[t]$ has a form $$\delta[t] = \sum_k w_{a_k}[t - d_k] \sum_{i \in \Lambda_k} g_i[t]$$

wherein for each term indexed by k, $a_k$ selects the transformed signal, $d_k$ determines the delay of said transformed signal, and $\Lambda_k$ determines the subset of the gain components.

Transforming a first derived signal of the derived signals according to a parametric non-linear transformation comprises performing a table lookup in a data table corresponding to said transformation according to the first derived signal to determine a result of the transforming.

The parametric non-linear transformation comprises a plurality of segments, each segment corresponding to a different range of values of the first derived signal, and wherein transforming the first derived signal according to the parametric non-linear transformation comprises determining a segment of the parametric non-linear transformation from the first derived signal and accessing data from the data table corresponding to a said segment.

The parametric non-linear transformation comprises a piecewise linear or a piecewise constant transformation, and the data from the data table corresponding to the segment characterizes endpoints of said segment.

The non-linear transformation comprises a piecewise linear transformation, and transforming the first derived signal comprises interpolating a value on a linear segment of said transformation.

The method further includes adapting configuration parameters of the parametric non-linear transformation according to sensed output of the non-linear circuit.

The method further includes acquiring a sensing signal (y) dependent on an output of the non-linear circuit, and wherein adapting the configuration parameters includes adjusting said parameters according to a relationship of the sensing signal (y) and at least one of the input signal (u) and the output signal (v).

Adjusting said parameters includes reducing a mean squared value of a signal computed from the sensing signal (y) and at least one of the input signal (u) and the output signal (v) according to said parameters.

Reducing the mean squared value includes applying a stochastic gradient procedure to incrementally update the configuration parameters.

Reducing the mean squared value includes processing a time interval of the sensing signal (y) and a corresponding time interval of at least one of the input signal) and the output signal (v).

The method includes performing a matrix inverse of a Gramian matrix determined from the time interval of the sensing signal and a corresponding time interval of at least one of the input signal (u) and the output signal (v).

The method includes forming the Gramian matrix as a time average Gramian.

The method includes performing coordinate descent procedure based on the time interval of the sensing signal and a corresponding e interval of at least one of the input signal (u) and the output signal (v).

Transforming a first derived signal of the plurality of derived signals according to a parametric non-linear transformation comprises performing a table lookup in a data table corresponding to said transformation according to the first derived signal to determine a result of the transforming, and wherein adapting the configuration parameters comprises updating values in the data table.

The parametric non-linear transformation comprises a greater number of piecewise linear segments than adjustable parameters characterizing said transformation.

The non-linear transformation represents a function that is a sum of scaled kernels, a magnitude scaling each kernel being determined by a different one of the adjustable parameters characterizing said transformation.

Each kernel comprises a piecewise linear function.

Each kernel is zero for at least some range of values of the derived signal.

In another aspect, in general, a digital predistorter circuit is configured to perform all the steps of any of the methods set forth above.

In another aspect, in general, a design structure is encoded on a non-transitory machine-readable medium. The design structure comprises elements that, when processed in a computer-aided design system, generate a machine-executable representation of the digital predistortion circuit that is configured to perform all the steps of any of the methods set forth above.

In another aspect, in general, a non-transitory computer readable media is programmed with a set of computer instructions executable on a processor. When these instructions are executed, they cause operations including all the steps of any of the methods set forth above.

DESCRIPTION

Figure 1:
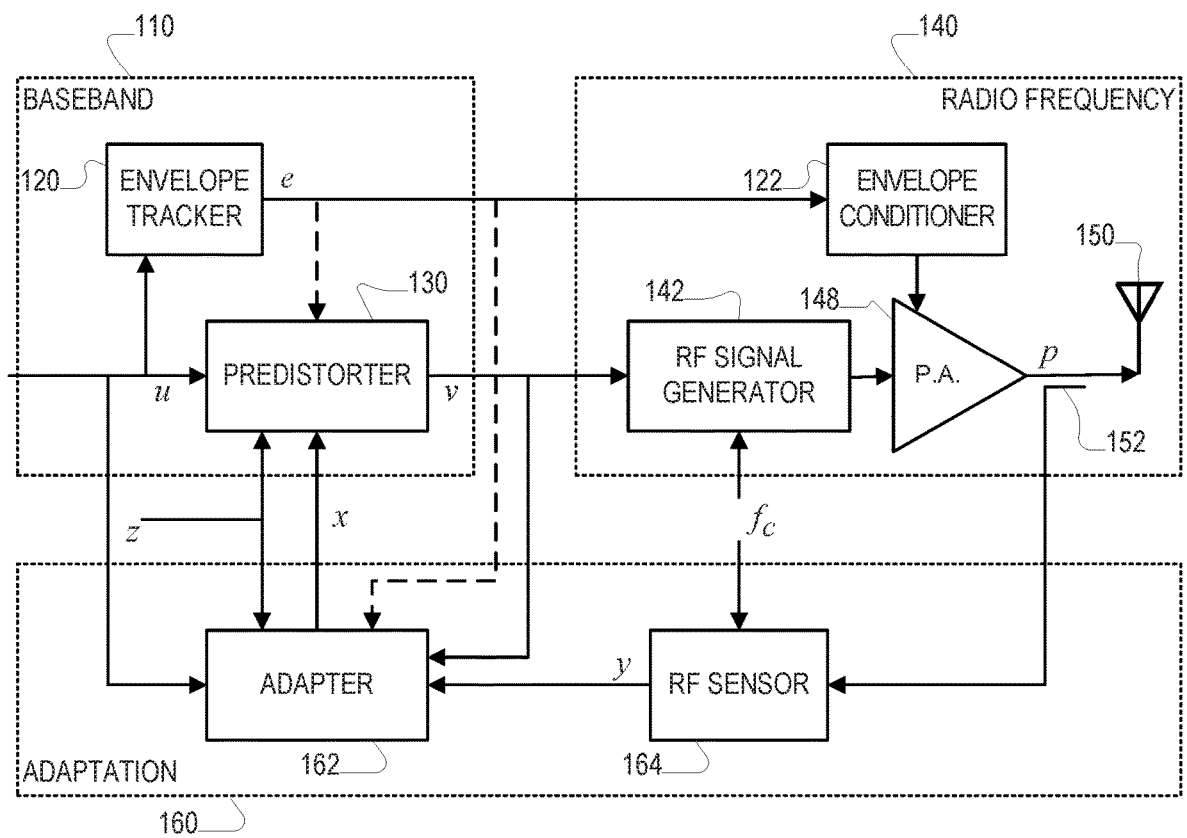
FIG. 1 is a block diagram of a radio transmitter.

Referring to FIG. 1, in an exemplary structure of a radio transmitter 100, a desired baseband input signal u[.] passes to a baseband section 110, producing a predistorted signal v[.] In the description below, unless otherwise indicated, signals such as u[.] and v[.] are described as complex-valued signals, with the real and imaginary parts of the signals representing the in-phase and quadrature terms (i.e., the quadrature components) of the signal. The predistorted signal v[.] then passes through a radio frequency (RF) section 140 to produce an RF signal p(.), which then drives a transmit antenna 150. In this example, the output signal is monitored (e.g., continuously or from time to time) via a coupler 152, which drives an adaptation section 160. The adaptation section also receives the input to the RF section, v[.] The adaptation section 150 determined values of parameters x, which are passed to the baseband section 110, and which affect the transformation from u[.] to v[.] implemented by that section.

The structure of the radio transmitter 100 shown in FIG. 1 includes an optional envelope tracking aspect, which is used to control the power (e.g., the voltage) supplied to a power amplifier of the RE section 140, such that less power is provided when the input u[.] has smaller magnitude over a short term and more power is provided when it has larger magnitude. When such an aspect is included, an envelope signal e[.] is provided from the baseband section 110 to the RF section 140, and may also be provided to the adaptation section 160.

The baseband section 110 has a predistorter 130, which implements the transformation from the baseband input u[.] to the input v[.] to the RF section 140. This predistorter is configured with the values of the configuration parameters x provided by the adaptation section 160 if such adaptation is provided. Alternatively, the parameter values are set when the transmitter is initially tested, or may be selected based on operating conditions, for example, as generally described in U.S. Pat. No. 9,590,668, "Digital Compensator."

In examples that include an envelope-tracking aspect, the baseband section 110 includes an envelope tracker 120, which generates the envelope signal e[.]. For example, this signal tracks the magnitude of the input baseband signal, possibly filtered in the time domain to smooth the envelope. In particular, the values of the envelope signal may be in the range [0,1], representing the fraction of a full range. In some examples, there are $N_E$ such components of the signal (i.e., $e[.]=(e_1[\ ],\ \ldots\ ,\ e_{N_E}[.])$, for example, with $e_1[.]$ may be a conventional envelope signal, and the other components may be other signals, such as environmental measurements, clock measurements (e.g., the time since the last "on" switch, such as a ramp signal synchronized with timedivision-multiplex (TDM) intervals), or other user monitoring signals. This envelope signal is optionally provided to the predistorter 130. Because the envelope signal may be provided to the RF section, thereby controlling power provided to a power amplifier, and because the power provided may change the non-linear characteristics of the RF section, in at least some examples, the transformation implemented by the predistorter depends on the envelope signal.

Turning to the RF section 140, the predistorted baseband signal v[.] passes through an RF signal generator 142, which modulates the signal to the target radio frequency band at a center frequency $f_c$. This radio frequency signal passes through a power amplifier (PA) 148 to produce the antenna driving signal p(.). In the illustrated example, the power amplifier is powered at a supply voltage determined by an envelope conditioner 122, which receives the envelope signal e[.] and outputs a time-varying supply voltage $V_c$ to the power amplifier.

As introduced above, the predistorter 130 is configured with a set of fixed parameters z, and values of a set of adaptation parameters x, which in the illustrated embodiment are determined by the adaptation section 160. Very generally, the fixed parameters determined the family of compensation functions that may be implemented by the predistorter, and the adaptation parameters determine the particular function that is used. The adaptation section 160 receives a sensing of the signal passing between the power amplifier 148 and the antenna 150, for example, with a signal sensor 152 preferably near the antenna (i.e., after the RF signal path between the power amplifier and the antenna, in order to capture non-linear characteristics of the passive signal path). RF sensor circuitry 164 demodulates the sensed signal to produce a representation of the signal band y[.], which is passed to an adapter 162. The adapter 162 essentially uses the inputs to the RF section, namely v[.] and/or the input to the predistorter u[.] (e.g., according to the adaptation approach implemented) and optionally e[.], and the representation of sensed output of the RF section, namely y[.]. In the analysis below, the RF section is treated as implementing a generally non-linear transformation represented as y[.]=F(v[.], e[.]) in the baseband domain, with a sampling rate sufficiently large to capture not only the bandwidth of the original signal u[.] but also a somewhat extended bandwidth to include significant non-linear components that may have frequencies outside the desired transmission band. In later discussions below, the sampling rate of the discrete time signals in the baseband section 110 is denoted as $f_s$.

In the adapter 162 is illustrated in FIG. 1 and described below as essentially receiving u[t] and/or v[t] synchronized with y[t]. However, there is a delay in the signal path from the input to the RE section 140 to the output of the RF sensor 164. Therefore, a synchronization section (not illustrated) may be used to account for the delay, and optionally to adapt to changes in the delay. For example, the signals are upsampled and correlated, thereby yielding a fractional sample delay compensation, which may be applied to one or the other signal before processing in the adaptation section. Another example of a synchronizer is described in U.S. Pat. No. 10,141,961, which is incorporated herein by reference.

Although various structures for the transformation implemented by the predistorter 130 may be used, in one or more embodiments described below, the functional form implemented is $v[.] = u[.] + \delta[.]$ where $\delta[.] = \Delta(u[.], e[.])$ and $\Delta(,)$, which may be referred to as the distortion term, is effectively parameterized by the parameters x. Rather than using a set of terms as outlined above for the Volterra or delay polynomial approaches, the present approach makes use of a multiple stage approach in which a diverse set of targeted distortion terms are combined in a manner that satisfies the requirements of low computation requirement, low storage requirement, and robustness, while achieving a high degree of linearization.

Very generally, structure of the function $\Delta(,)$ is motivated by application of the Koltnogorov Superposition Theorem (KST). One statement of KST is that a non-linear function of d arguments $x_1, \ldots x_d \in [0,1]^d$ may be expressed as $$\sum_{i=1}^{2d+1} g_i\left(\sum_{j=1}^{d} h_{ij}(x_j)\right)$$

for some functions $g_i$ and $h_{ij}$. Proofs of the existence of such functions may concentrate on particular types of non-linear functions, for example, fixing the $h_{ij}$ and proving the existence of suitable $g_i$. In application to approaches described in this document, this motivation yields a class of non-linear functions defined by constituent non-linear functions somewhat analogous to the $g_i$ and/or the $h_{ij}$ in the KST formulation above.

Figure 2:
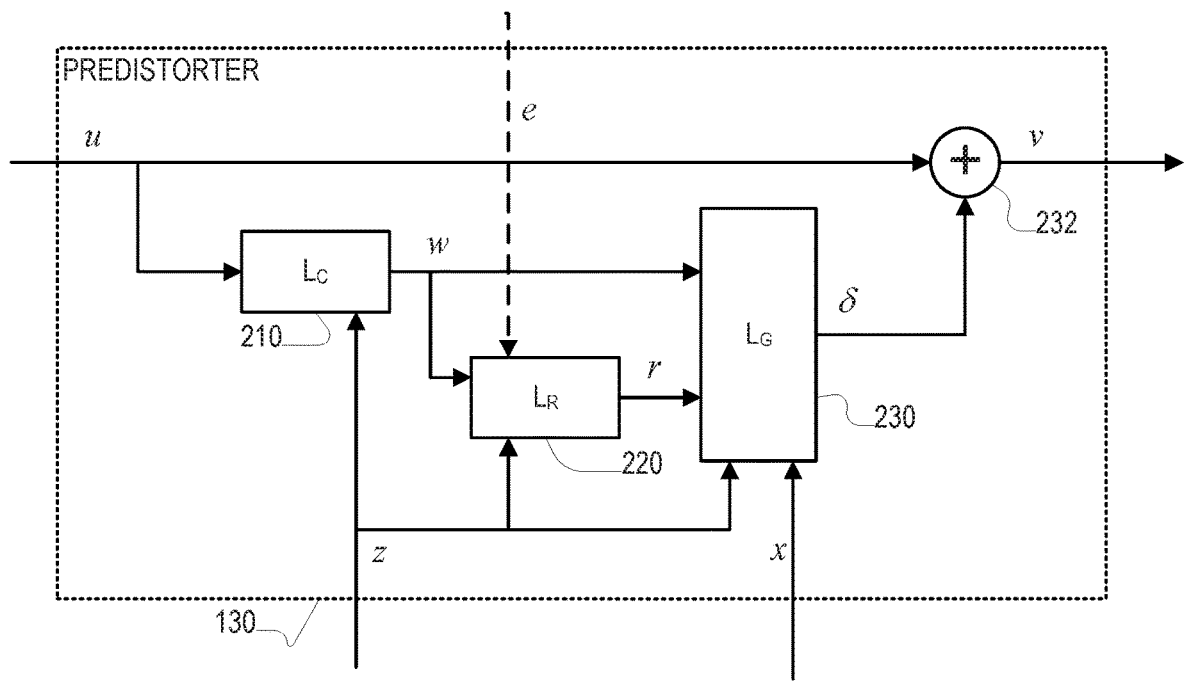
FIG. 2 is a block diagram of the pre-distorter of FIG. 1.

Referring to FIG. 2, the predistorter performs a series of transformations that generate a diverse set of building blocks for forming the distortion term using an efficient table-driven combination. As a first transformation, the predistorter includes a complex transformation component 210, labelled $L_C$ and also referred to as the "complex layer." Generally, the complex layer receives the input signal, and outputs multiple transformed signals. In the present embodiment, the input to the complex transformation component is the complex input baseband signal, u[.], and the output is a set of complex baseband signals, [w], which may be represented as a vector of signals and indexed $w_1[.], w_2[.], \ldots, w_{N_W}[.]$, where $N_W$ is the number of such signals. Very generally, these complex baseband signals form terms for constructing the distortion term. More specifically; the distortion term is constructed as a weighted summation of the set of baseband signals, where the weighting is time varying; and determined based on both the inputs to the predistorter 130, u[.] and e[.], as well as the values of the configuration parameters, x. Going forward, the denotation of signals with "." is omitted, and the context should make evident when the signal as a whole is referenced versus a particular sample.

Note that as illustrated in FIG. 2, the complex layer 210 is configured with values of fixed parameters z, but does not depend of the adaptation parameters x. For example, the fixed parameters are chosen according to the type of RF section 140 being linearized, and there fixed parameters determine the number $N_W$ of the complex signals generated, and their definition.

In one implementation, the set of complex baseband signals includes the input itself; $w_1 = u$, as well as well as various delays of that signal, for example, $w_k = u[t-k+1]$ for $k = 1, \ldots, N_W$. In another implementation, the complex signals output from the complex layer are arithmetic functions of the input, for example $(u[t]+u[t-1])/2;$ $(u[t]+ju[t-1])/2;$ and $((u[t]u[t-1])/2+u[t-2])/2.$ In at least some examples, these arithmetic functions are selected to limit the computational resources by having primarily additive operations and multiplicative operations by constants that may be implemented efficiently (e.g., division by 2). In another implementation, a set of relatively short finite-impulse-response (FIR) filters modify the input u[t] to yield $w_k[t]$, where the coefficients may be selected according to time constants and resonance frequencies of the RF section In yet another implementation, the set of complex baseband signals includes the input itself, $w_1=u$, as well as well as various combinations, for example, of the form $$w_k = 0.5(D_a w_a + j^d w_b)$$

where $D_\alpha$ represents a delay of a signal by an integer number $\alpha$ samples, and d is an integer, generally with $d \in \{0, 1, 2, 3\}$ may depend on k and k>a, b (i.e., each signal $w_k$ may be defined in terms of previously defined signals), such that $$w_k[t] = 0.5(w_a[t-\alpha] + j^d w_b[t])$$

There are various ways of choosing which combinations of signals (e.g., the a, b, d values) determine the signals constructed. One way is essentially by trial and error, for example, adding signals from a set of values in a predetermined range that most improve performance in a greedy manner (e.g., by a directed search) one by one.

Continuing to refer to FIG. 2, a second stage is a real transformation component 220, labelled $L_R$ and also referred to as the "real layer." The real transformation component receives the $N_W$ signals w, optionally as well as the envelope signal e, and outputs $N_R$ (generally greater than $N_W$) real signals r, in a bounded range, in the implementation in a range [0,1]. In some implementations, the real signals are scaled, for example, based on a fixed scale factor that is based on the expected level of the input signal u. In some implementations, the fixed parameters for the system may include a scale (and optionally an offset) in order to achieve a typical range of [0,1]. In yet other implementations, the scale factors may be adapted to maintain the real values in the desired range.

In one implementation, each of the complex signals $w_k$ passes to one or more corresponding non-linear functions $f(w)$, which accepts a complex value and outputs a real value r that does not depend on the phase of its input (i.e., the function is phase-invariant). Examples of these non-linear functions; with an input $u = u_{re} + j u_{im}$ include the following $$|w| = |w_{re} + j w_{im}| = (w_{re}^2 + w_{im}^2)^{1/2};$$

$$ww^* = |w|^2;$$

$$\log(a + ww^*); \text{ and}$$

$$|w|^{1/2}.$$

In at least some examples, the non-linear function is monotone or non-decreasing in norm (e.g., an increase in w corresponds to an increase in $r = f(u)$).

In some implementations, the output of a non-linear, phase-invariant function may be filtered, for example, with a real linear time-invariant filters. In some examples, each of these filters is an Infinite Impulse-Response (IIR) filter implemented as having a rational polynomial Laplace or Z Transform (i.e., characterized by the locations of the poles and zeros of the Transform of the transfer function). An example of a Z transform for an IIR filter is:

$$\frac{Y(z)}{X(z)} = \frac{z-q}{z^2 - 2qz + p}$$

where, for example, p=0.7105 and q=0.8018. In other examples, a Finite Impulse-Response (FIR). An example of a FIR filter with input x and output y is:

$$y[n+1] = \sum_\tau (1 - 2^{-k})^\tau x[n-\tau],$$

for example with k=1 or k=4.

In yet another implementation, the particular signals are chosen (e.g., by trial and error, in a directed search, iterative optimization, etc.) from one or more of the following families of signals:

a. $r_k = e_k$ for k=1, . . . , $N_E$, where $e_1, \ldots, e_{N_E}$ are the optional components of signal e;

b. $r_k[t] = |w_a[t]|^\alpha$ for all t, where $\alpha > 0$ (with $\alpha=1$ or $\alpha=2$ being most common) and $a \in \{1, \ldots, N_W\}$ may depend on k;

c. $r_k[t] = 0.5(1 - \theta + r_a[t-\alpha] + \theta r_b[t])$ for all t, where $\theta \in \{1, -1\}$, $a, b \in \{1, \ldots, k-1\}$, and $\alpha$ is an integer that may depend on k;

d. $r_k[t] = r_a[t-\alpha] r_b[t]$ for all t, where $a, b \in \{1, \ldots, k-1\}$ and $\alpha$ is an integer that may depend on k;

e. $r_k[t] = r_k[t-1] + 2^{-d}(r_a[t] - r_k[t-1])$ for all t, where $a \in \{1, \ldots, k-1\}$ and integer d, d>0, may depend on k (equivalently, $r_k$ is the response of a first order linear time invariant (LTI) filter with a pole at $1 - 2^{-d}$, applied to $r_a$ for some a<k f. $r_k$ is the response (appropriately scaled and centered) of a second order LTI filter with complex poles (carefully selected for easy implementability), applied to $r_a$ for some $a \in \{1, \ldots, k-1\}$.

As illustrated in FIG. 2, the real layer 220 is configured by the fixed parameters z, which determine the number of real signals $N_R$, and their definition. However, as with the complex layer 210, the real layer does not depend on the adaptation parameters x. The choice of real functions may depend on characteristics of the RF section 140 in a general sense, for example, being selected based on manufacturing or design-time considerations, but these functions do not generally change during operation of the system while the adaptation parameters x may be updated on an ongoing basis in at least some implementations.

According to (a), the components of e are automatically treated as real signals (i.e., the components of r). Option (b) presents a convenient way of converting complex signals to real ones while assuring that scaling the input u by a complex constant with unit absolute value does not change the outcome (i.e., phase-invariance). Options (c) and (d) allow addition, subtraction, and (if needed) multiplication of real signals. Option (e) allows averaging (i.e., cheaply implemented low-pass filtering) of real signals and option (f) offers more advanced spectral shaping, which is needed for some real-world power amplifiers 148, which may exhibit a second order resonance behavior. Note that more generally, the transformations producing the r components are phase invariant in the original baseband input u, that is, multiplication of u[t] by $\exp(j\theta)$ or $\exp(j\omega t)$ does not change $r_p[t]$.

Constructing the signals w and r can provide a diversity of signals from which the distortion term may be formed using a parameterized transformation. In some implementations, the form of the transformation is as follows:

$$\delta[t] = \sum_k w_{a_k}[t - d_k]\Phi_k^{(x)}(r[t]).$$

The function $\Phi^{(x)}(r)$ takes as an argument the $N_R$ components of r, and maps those values to a complex number according to the parameters values of x. That is, each function $\Phi_k^{(x)}(r)$ essentially provides a time-varying complex gain for the $k^{th}$ term in the summation forming the distortion term. With up to D delays (i.e., $0 \le d_k$, D) and $N_W$ different w[t] functions, there are up to $N_W D$ terms in the sum. The selection of the particular terms (i.e., the values of $a_k$ and $d_k$) is represented in the fixed parameters z that configure the system.

Rather than configuring functions of $N_R$ arguments, some embodiments structure the $\Phi_k^{(x)}(r)$ functions as a summation of functions of single arguments as follows:

$$\Phi_k^{(x)}(r[t]) = \sum_j \phi_{k,j}(r_j[t])$$

where the summation over j may include all $N_R$ terms, or may omit certain terms. Overall, the distortion term is therefore computed to result in the following:

$$\delta[t] = \sum_k w_{a_k}[t - d_k] \sum_j \phi_{k,j}(r_j[t]).$$

Again, the summation over j may omit certain terms, for example, as chosen by the designer according to their know-how and other experience or experimental measurements. This transformation is implemented by the combination stage 230, labelled $L_R$ in FIG. 2. Each term in the sum over k uses a different combination of a selection of a component $a_k$ of w and a delay $d_k$ for that component. The sum over j yields a complex multiplier for that combination, essentially functioning as a time-varying gain for that combination.

As an example of one term in summation that yields the distortion term, consider $w_1 = u$, and $r = |u|^2$ (i.e., applying transformation (b) with a=1, and $\alpha$=2), which together yield a term of the form u $\phi(|u|^2)$ where $\phi(\ )$ is one of the parameterized scalar functions. Note the contrast of such a term as compared to a simple scalar weighting of a terms u $|u|^2$, which lack the larger number of degrees of freedom obtainable though the parameterization of $\phi(\ )$.

Each function $\phi_{k,j}(r_j)$ implements a parameterized mapping from the real argument $r_j$, which is in the range [0,1], to a complex number, optionally limited to complex numbers with magnitudes less than or equal to one. These functions are essentially parameterized by the parameters x, which are determined by the adaptation section 160 (see FIG. 1). In principal, if there are $N_W$ components of w, and delays from 0 to D−1 are permitted, and each component of the $N_R$ components of r may be used, then there may be up to a total of $N_W \cdot D \cdot N_R$ different functions $\phi_{k,j}(\ )$.

In practice, a selection of a subset of these terms are used, being selected for instance by trial-and-error or greedy selection. In an example of a greedy iterative selection procedure, a number of possible terms (e.g., w and r combinations) are evaluated according to their usefulness in reducing a measure of distortion (e.g., peak or average RMS error, impact on EVM, etc. on a sample data set) at an iteration and one or possible more best terms are retained before proceeding to the next iteration where further terms may be selected, with a stopping rule, such as a maximum number of terms or a threshold on the reduction of the distortion measure. A result is that for any term k in the sum, only a subset of the $N_R$ components of r are generally used. For a highly nonlinear device, a design generally works better employing a variety of $r_k$ signals. For nonlinear systems with strong memory effect (i.e., poor harmonic frequency response), the design tends to require more shifts in the $w_k$ signals. In an alternative selection approach, the best choices of $w_k$ and $r_k$ with given constraints starts with a universal compensator model which has a rich selection of $w_k$ and $r_k$, and then an L1 trimming is used to restrict the terms.

Figure 4A:
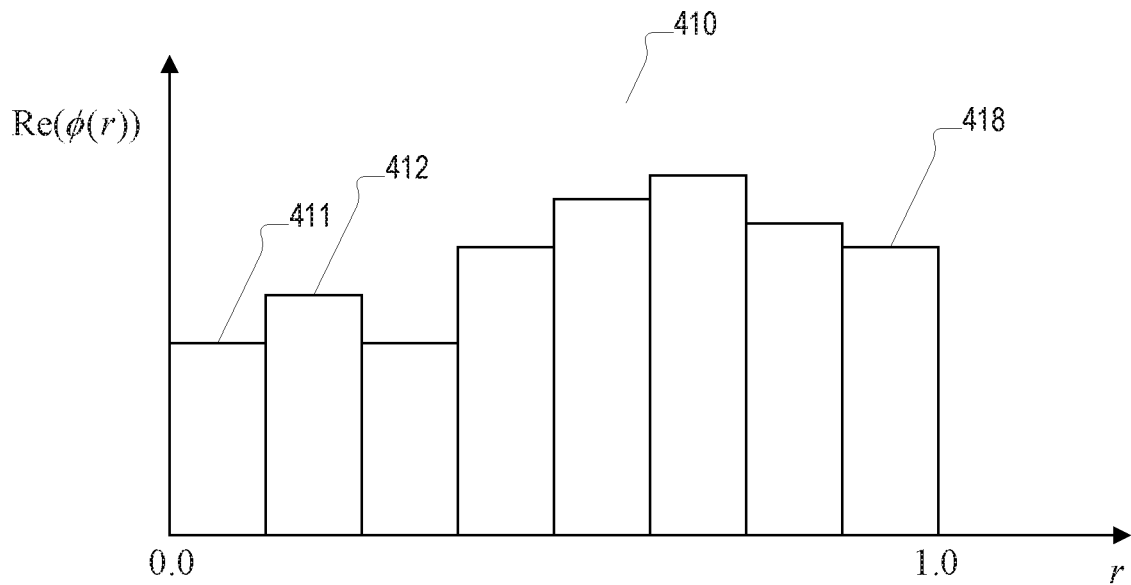
FIGS. 4A-E are graphs of example gain functions.

Referring to FIG. 4A, one functional form for the $\phi_{k,j}(r_j)$ functions, generically referred to as $\phi(r)$, is as a piecewise constant function 410. In FIG. 4A, the real part of such a piecewise constant function is shown in which the interval from 0.0 to 1.0 is divided into 8 section (i.e., $2^S$ sections for S=3). In embodiments that use such form, the adaptive parameters x directly represent the values of these piecewise constant sections 411, 412-418. In FIG. 4A, and in examples below, the r axis is divided in regular intervals, in the figure in equal width intervals. The approaches described herein do not necessarily depend on uniform intervals, and the axis may be divide in unequal intervals, with all functions using the same set of intervals or different functions potentially using different intervals. In some implementations, the intervals are determined by the fixed parameters z of the system.

Figure 4B:
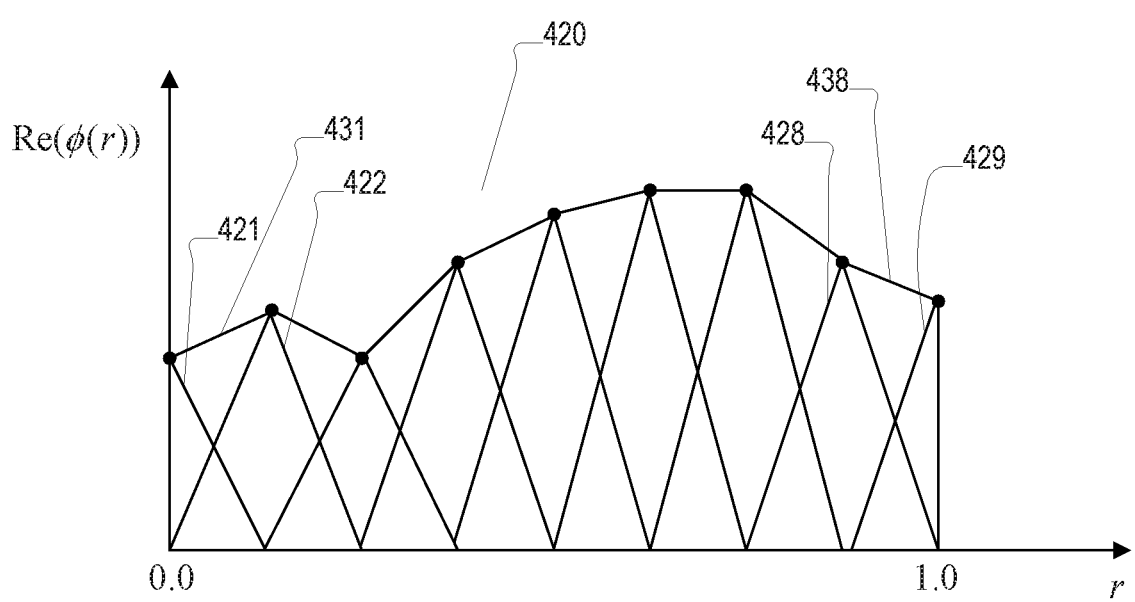

Referring to FIG. 4B, another form of function is a piecewise linear function 420. Each section 431-438 is linear and is defined by the values of its endpoints. Therefore, the function 420 is defined by the 9 (i.e., $2^S+1$) endpoints. The function 420 can also be considered to be the weighted sum of predefined kernels $b_l(r)$ for l=0, ..., L−1, in this illustrated case with L=$2^S$+1=9. In particular, these kernels may be defined as:

$$b_0(r) = \begin{cases} 1 - rL & \text{for } 0 \le r \le 1/L \\ 0 & \text{otherwise} \end{cases},$$

$$b_i(r) = \begin{cases} 1 + (r - i/L)L & \text{for } (i-1)/L \le r \le i/L \\ 1 - (r - i/L)L & \text{for } i/L \le r \le (i+1)/L, \text{ for } 0 < i < L, \text{ and} \\ 0 & \text{otherwise} \end{cases}$$

$$b_L(r) = \begin{cases} 1 + (r - 1)L & \text{for } (L-1)/L \le r \le 1/L \\ 0 & \text{otherwise} \end{cases}.$$

The function 420 is then effectively defined by the weighted sum of these kernels as:

$$f(r) = \sum_{l=1}^{L} x_l b_l(r)$$

where the $x_l$ are the values at the endpoints of the linear segments.

Figure 4C:
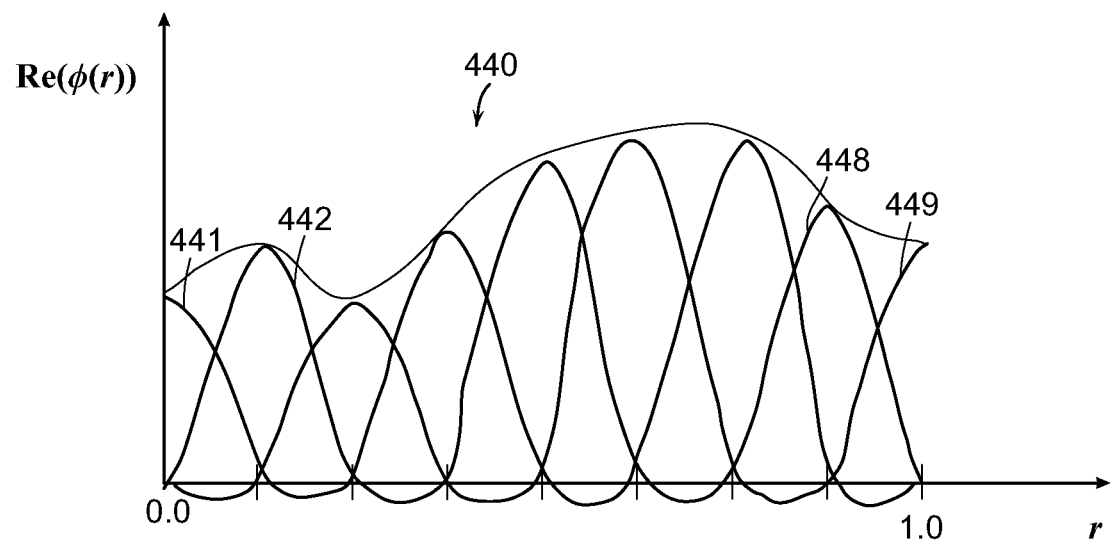

Referring to FIG. 4C, different kernels may be used. For example, a smooth function 440 may be defined as the summation of weighted kernels 441, 442-449. In some examples, the kernels are non-zero over a restricted range of values of r, for example, with $b_i(r)$ being zero for r outside $[(i-n)/L,(i+n)/L]$ for $n=1$, or some large value of $n<L$.

Figure 4D:
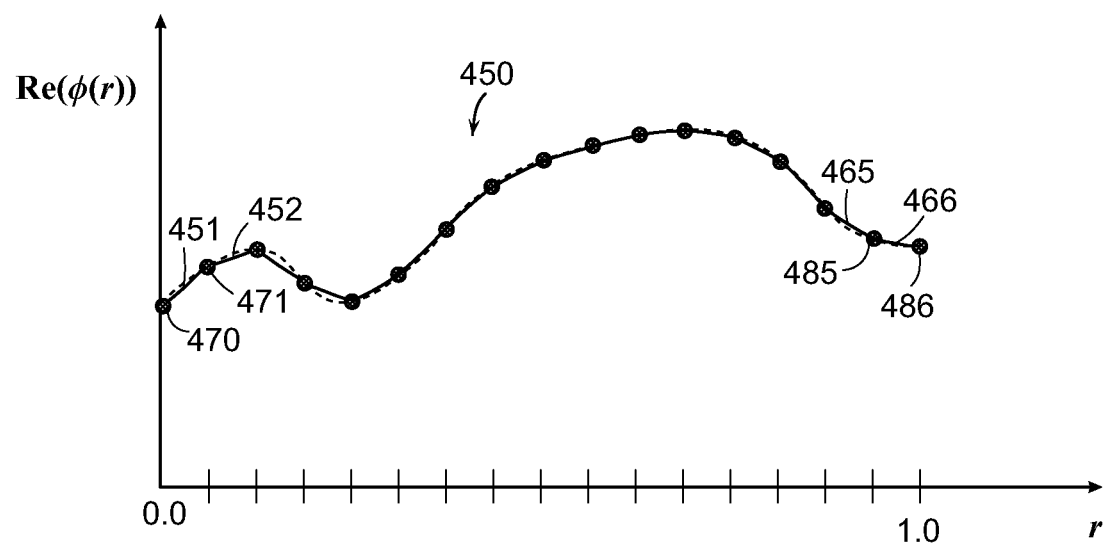

Referring to FIG. 4D, in some examples, piecewise linear function forms an approximation of a smooth function. In the example shown in FIG. 4D, a smooth function, such as the function in FIG. 4C, is defined by 9 values, the multiplier for kernel functions $b_0$ through $b_9$. This smooth function is then approximated by a larger number of linear sections 451-466, in this case 16 section defined by 17 endpoints. 470, 471-486. As is discussed below, this results in there being 9 (complex) parameters to estimate, which are then transformed to 17 parameters for configuring the predistorter. Of course, different number of estimated parameters and linear sections may be used. For example, 4 smooth kernels may be used in estimation and then 32 linear sections may be used in the runtime predistorter.

Figure 4E:
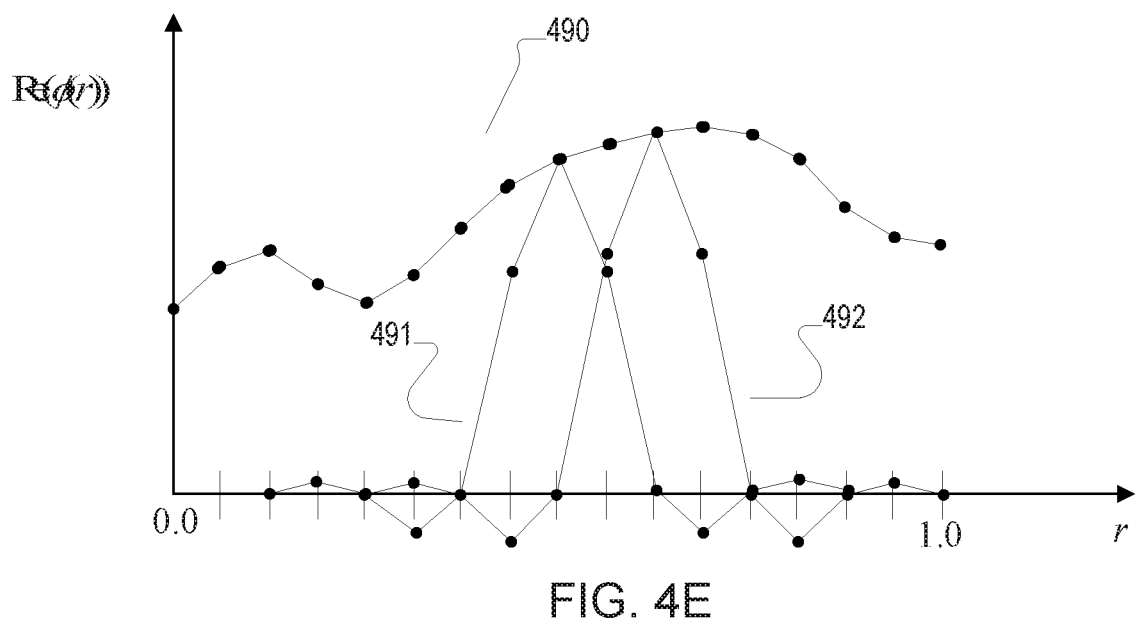

Referring to FIG. 4E, in another example, the kernel functions themselves are piecewise linear. In this example, 9 kernel functions, of which two 491 and 492 are illustrated, are used. Because the kernels have linear segments of length $\frac{1}{16}$, the summation of the 9 kernel functions result in a function 490 that has 16 linear segments. One way to form the kernel functions is a $1/M^{th}$ band interpolation filter, in this illustration a half-band filter. In another example that is not illustrated, 5 kernels can be used to generate the 16-segment function essentially by using quarter-band interpolation filters. The specific form of the kernels may be determined by other approaches, for example, to optimize smoothness or frequency content of the resulting functions, for example, using linear programming of finite-impulse-response filter design techniques.

It should also be understood that the approximation shown in FIG. 4D-E do not have to be linear. For example, a low-order spline may be used to approximate the smooth function, with fixed knot locations (e.g., equally spaced along the r axis, or with knots located with unequal spacing and/or at locations determined during the adaptation process, for example, to optimize a degree of fit of the splines to the smooth function.

Figure 3:
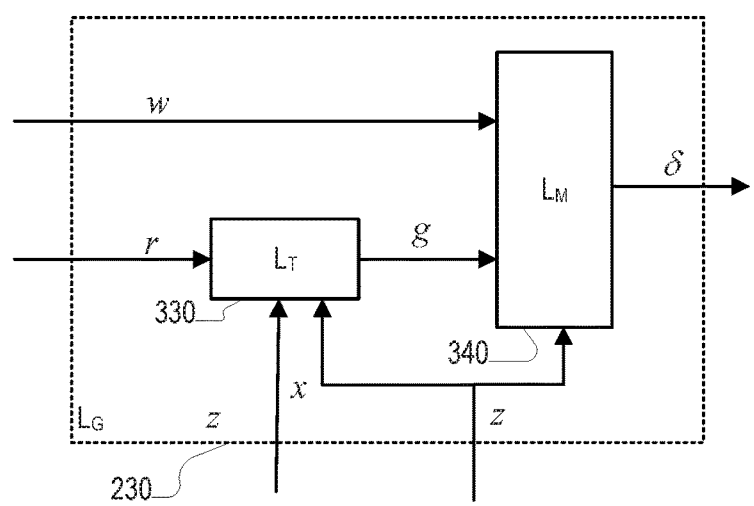
FIG. 3 is a block diagram of a distortion signal combiner of FIG. 2.

Referring to FIG. 3, the combination stage 230 is implemented in two parts: a lookup table stage 330, and a modulation stage 340. The lookup table stage 330, labelled $L_T$, implements a mapping from the $N_R$ components of r to $N_G$ components of a complex vector g. Each component $g_i$ corresponds to a unique function $\phi_{k,j}$ used in the summation shown above. The components of g corresponding to a particular term k have indices i in a set denoted $\Lambda_k$. Therefore, the combination sum may be written as follows:

$$\delta[t] = \sum_k w_{a_k}[t - d_k] \sum_{i \in \Lambda_k} g_i[t].$$

This summation is implemented in the modulation stage 340 shown in FIG. 3. As introduced above, the values of the $a_k$, $d_k$, and the $\Lambda_k$ are encoded in the fixed parameters z.

Note that the parameterization of the predistorter 130 (see FIG. 1) is focused on the specification of the functions $\phi_{k,j}()$. In a preferred embodiment, these functions are implemented in the lookup table stage 330. The other parts of the predistorter, including the selection of the particular components of w that are formed in the complex transformation component 210, the particular components of r that are formed in the real transformation component 220, and the selection of the particular functions $\phi_{k,j}()$ that are combined in the combination stage 230, are fixed and do not depend on the values of the adaptation parameters x.

One efficient approach to implementing the lookup table stage 330 is to restrict each of the functions $\phi_{k,j}()$ to have a piecewise constant or piecewise linear form. Because the argument to each of these functions is one of the components of r, the argument range is restricted to [0,1], the range can be divided into $2^s$ sections, for example, $2^s$ equal sized sections with boundaries at $i2^{-s}$ for $i \in \{0, 1, \ldots, 2^s\}$. In the case of piecewise constant function, the function can be represented in a table with $2^s$ complex values, such that evaluating the function for a particular value of $r_j$ involves retrieving one of the values. In the case of piecewise linear functions, a table with $1+2^s$ values can represent the function, such that evaluating the function for a particular value of $r_j$ involves retrieving two values from the table for the boundaries of the section that $r_j$ within, and appropriately linearly interpolating the retrieved values.

Figure 5:
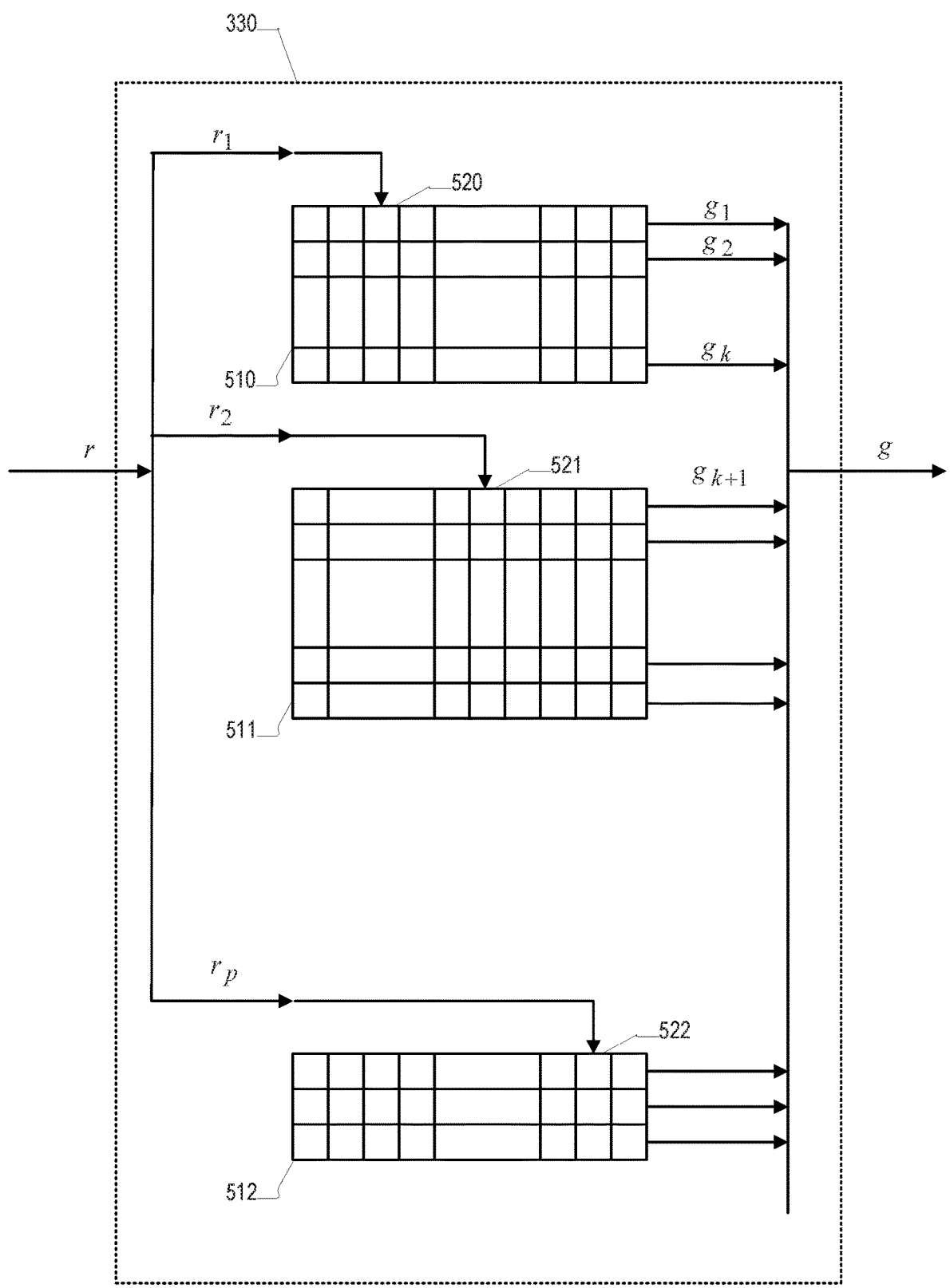
FIG. 5 is a diagram of a table-lookup implementation of a gain lookup section of FIG. 2.

Referring to FIG. 5, one implementation of the lookup table stage 330, in this illustration for piecewise constant functions, makes use of a set of tables (or parts of one table) 510-512. Table 510 has one row for each function $\phi_{k,1}(r_1)$, table 511 has one row for each function $\phi_{k,2}(r_2)$, and so forth. That is, each row represents the endpoints of the linear segments of the piecewise linear form of the function. In such an arrangement, each of the tables 510-512 will in general have a different number of rows. Also, it should be understood that such an arrangement of separate tables is logical, and the implemented data structures may be different, for example, with a separate array of endpoint values for each function, not necessarily arranged in tables as shown in FIG. 5. To implement the mapping from r to g each element $r_j$ is used to select a corresponding column in the $j^{th}$ table, and the values in that column are retrieved to form a portion of g. For example; the $r_1^{th}$ column 520 is selected for the first table 410, and the values in that column are retrieved as $g_1$, $g_2$, . . . . This process is repeated for the $r_2^{nd}$ column 421 of table 511, the $r_3^{rd}$ column 522 of table 512 and so forth to determine all the component values of g. In an embodiment in which piecewise linear functions are used, two columns may be retrieved, and the values in the columns are linearly interpolated to form the corresponding section of g. It should be understood that the table structure illustrated in FIG. 5 is only one example, and that other analogous data structures may be used within the general approach of using lookup tables rather than extensive use of arithmetic functions to evaluate the functions $\phi_{k,j}()$. It should be recognized that while the input $r_p$ is real, the output $g_i$ is complex. Therefore the cells of the table can be considered to hold pairs of values for the real and imaginary parts of the output, respectively.

Figure 6A:
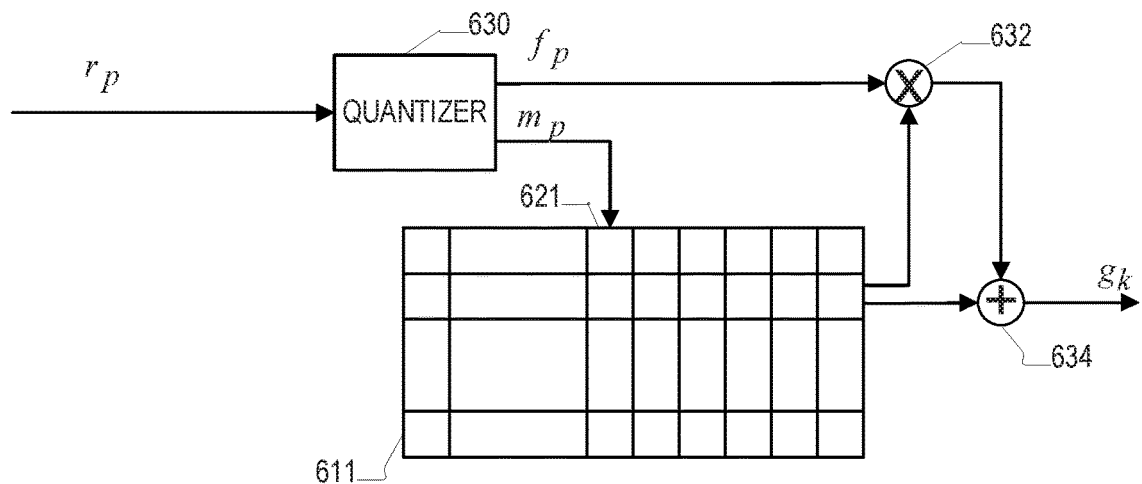
FIG. 6A-B are diagrams of a section of a table lookup for piecewise linear functions.
Figure 6B:
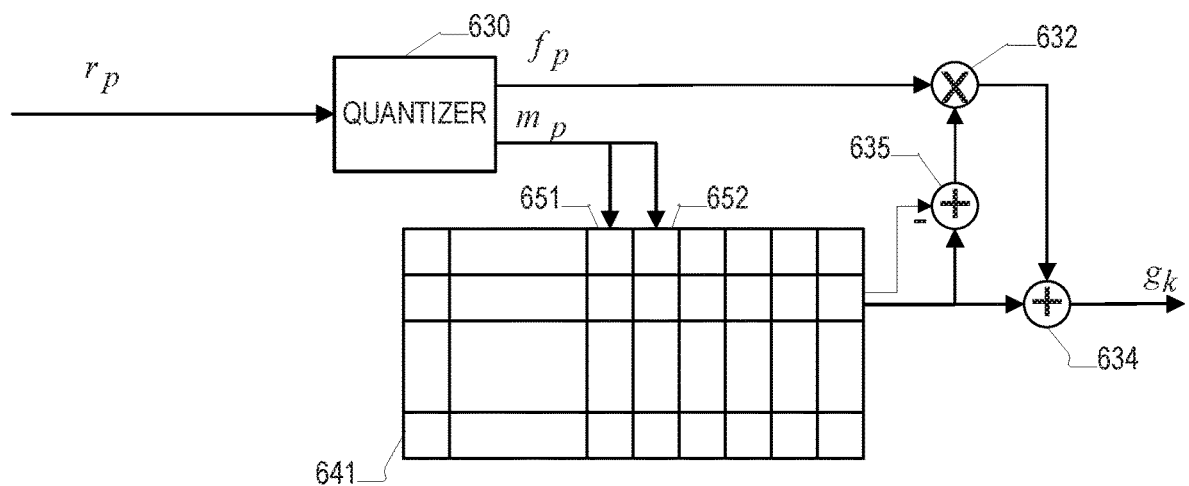

The lookup table approach can be applied to piecewise linear function, as illustrated in FIG. 6A for one representative transformation $g_k = \phi(r_p)$. The value $r_p$ is first processed in a quantizer 630, which determines which segment $r_p$ falls on, and output $m_p$ representing that segment. The quantizer also output a "fractional" part $f_p$, which represents the location of $r_p$ in the interval for that segment. Each cell in the column 621 identified by $m_p$ has two quantities, which essentially define one endpoint and the slope of the segment. The slope is multiplied in a multiplier 632 by the fractional part $f_p$, and the product is added in an adder 634 to yield the value $g_k$. Of course this is only one implementation, and different arrangements of the values stored in the table 611, or in multiple tables, and the arrangement of the arithmetic operators on selected values from the table to yield the value g may be used. FIG. 6B shows another arrangement for use with piecewise linear functions. In this arrangement, the output m selects two adjacent columns of the table, which represent the two endpoint values. Such an arrangement reduces the storage by a factor of two as compared to the arrangement of FIG. 6A. However, because the slope of the linear segments are not stored, an adder 635 is used to take the difference between the endpoint values, and then this difference is multiplied by $f_p$ and added to one of the endpoint values in the manner of FIG. 6A.

As introduced above, the particular constructions used to assemble the complex signals $w_k$ and real signals $r_k$ may be based on trial-and-error, analytical prediction of impact of various terms, heuristics, and/or a search or combinatorial optimization to select the subset for a particular situation (e.g., for a particular power amplifier, transmission band, etc). One possible optimization approach may make use of greedy selection of productions to add to a set of $w_k$ and $r_k$ signals according to their impact on an overall distortion measure.

Very generally, the parameters x of the predistorter 130 (see FIG. 1), which implements the compensation function C, may be selected to minimize a distortion between a desired output (i.e., the input to the compensator) u[.], and the sensed output of the power amplifier y[.] For example, the parameters x, which may be the values defining the piecewise constant or piecewise linear functions $\phi$, are updated, for example, in a gradient-based iteration based on a reference pair of signals (u[.], y[.]), for example, adjusting the values of the parameters such that u[.]=y[.]. In some examples that make use of tables, for example with $2^S$ entries, to encode the non-linear functions $\phi_k(\ )$ each entry may be estimated in the gradient procedure. In other examples, a smoothness or other regularity is enforced for these functions by limiting the number of degrees of freedom to less than $2^S$, for example, by estimating the non-linear function as a being in the span (linear combination) of a set of smooth basis functions. After estimating the combination of such functions, the table is then generated.

Therefore, the adaptation section 160 essentially determines the parameters used to compute the distortion term as $\delta[t]=\Delta(u[t-\tau], \ldots, u[t-1])$ in the case that $\tau$ delayed values of the input u are used. More generally, $\tau_d$ delayed values of the input and $\tau_f$ look-ahead values of the input are used. This range of inputs is defined for notational conveniences as $q_u[t]=(u[t-\tau_d], \ldots, u[t+\tau_f])$. (Note that with the optional use of the terms e[t], these values are also included in the $q_u([t])$ term.) This term is parameterized by values of a set of complex parameters x therefore the function of the predistorter can be expressed as $$v[t]=C(q_u[t])=u[t]+\Delta(q_u[t])$$

One or more approaches to determining the values of the parameter $x$ that define the function $\delta(\ )$ are discussed below.

The distortion term can be viewed in a form as being a summation $$\delta[t] = \sum_b \alpha_b B_b(q_u[t])$$

where the $\alpha_b$ are complex scalars, and $B_b(\ )$ can be considered to be basis functions evaluated with the argument $q_u[t]$. The quality of the distortion term generally relies on there being sufficient diversity in the basis functions to capture the non-linear effects that may be observed. However, unlike some conventional approaches in which the basis functions are fixed, and the terms $\alpha_b$ are estimated directly, or possibly are represented as functions of relatively simple arguments such as |u[t]|, in approaches described below, the equivalents of the basis functions $B_b(\ )$ are themselves parameterized and estimated based on training data. Furthermore, the structure of this parameterization provides both a great deal of diversity that permits capturing a wide variety of non-linear effects, and efficient runtime and estimation approaches using the structure.

As discussed above, the complex input u[t] to produce a set of complex signals $w_k[t]$ using operations such as complex conjugation and multiplication of delayed versions of u[t] or other $w_k[t]$. These complex signals are then processed to form a set of phase-invariant real signals $r_p[t]$ using operations such as magnitude, real, or imaginary parts, of various $w_k[t]$ or arithmetic combinations of other $r_p[i]$ signals. In some examples, these real values are in the range [0,1.0] or [-1,0,1.0], or in some other predetermined bounded range. The result is that the real signals have a great deal of diversity and depend on a history of u[t] at least by virtue of at least some of the $w_k[t]$ depending on multiple delays of u[t]. Note that computation of the $w_k[t]$ and $r_p[t]$ can be performed efficiently. Furthermore, various procedures may be used to retain only the most important of these terms for any particular use case, thereby further increasing efficiency.

Before turning to the parameter estimation approach, recall that the distortion term can be represented as $$\delta[t] = \sum_k w_{a_k}[t-d_k]\Phi_k(r[t])$$

where r[t] represents the entire of the $r_p[t]$ real quantities, and $\Phi(\ )$ is a parameterized complex function. For efficiency of computation, this non-linear function is separated into terms that each depend on a single real value as $$\Phi_k(r[t]) = \sum_p \phi_{k,p}(r_p[t]).$$

For parameter estimation purposes, each of the non-linear functions $\phi(\ )$ may be considered to be made up of a weighted sum of the fixed kernels $b_l(r)$, discussed above with reference to FIGS. 4A-D, such that $$\phi_{k,p}(r_p) = \sum_l x_{k,p,l} b_l(r_p)$$

Introducing the kernel form of non-linear functions into the definition of the distortion term yields $$\delta[t] = \sum_{k,p,l} x_{k,p,l} w_{a_k}[t-d_k] b_l(r_p[t]).$$

In this form representing the triple (k, p, l) as b, the distortion term can be expressed as $$\delta[t] = \sum_b x_b B_b[t],$$

where $$B_b[t] \triangleq B_b(q_u[t]) = w_{a_k}[t-d_k] b_l(r_p[t]).$$

It should be recognized that for each time t, the complex values $B_b[t]$ depends on the fixed parameters z and the input u over a range of times, but does not depend on the adaptation parameters x. Therefore the complex values $B_b[t]$ for all the combinations b=(k, p, l) can be treated used in place of the input in the adaptation procedure.

An optional approach extends the form of the distortion term to introduce linear dependence on a set of parameter values, $p_1[t], \ldots, p_d[t]$, which may, for example be obtained by monitoring temperature, power level, modulation center frequency, etc. In some cases, the envelope signal e[t] may be introduced as a parameter. Generally, the approach is to augment the set of non-linear functions according to a set of environmental parameters $p_1[t], \ldots, p_d[t]$ so that essentially each function $$\phi_{k,p}(r)$$

is replaced with d linear multiples to form d+1 functions $$\phi_{k,p}(r), \phi_{k,p}(r) p_1[t], \ldots, \phi_{k,p}(r) p_d[t]$$

This essentially forms the set of basis functions $$B_b(q_u[t]) \triangleq w_{a_k}[t-d_k] b_l(r_p[t]) p_d[t]$$

where b represents the tuple (k, p, l, d) and $p_0=1$.

What should be evident is that this form achieves a high degree of diversity in the functions $B_b( )$ without incurring runtime computational cost that may be associated with conventional techniques that have a comparably diverse set of basis functions. Determination of the parameter values $x_b$ generally can be implemented in one of two away: direct and indirect estimation. In direct estimation, the goal is to adjust the parameters x according to the minimization:

$$x \leftarrow \operatorname{argmin}_x \|C(u) - (v - y + u)\| = \operatorname{argmin}_x \sum_{t \in T} |\Delta(q_u[t]) - (v[t] - y[t])|^2$$

where the minimization varies the function $\Delta(q_u[t])$ while the terms $q_u[t]$, v[t], and y[t] are fixed and known. In indirect estimation, the goal is to determine the parameters x according to the minimization $$x \leftarrow \operatorname{argmin}_x \|C(y) - v\| = \operatorname{argmin}_x \sum_{t \in T} |(y[t] + \Delta(q_y[t])) - v[t]|^2$$

Where $q_y[t]$ is defined in the same manner as $q_u[t]$, except using y rather than u Solutions to both the direct and indirect approaches are similar, and the indirect approach is described in detail below.

Adding a regularization term, an objective function for minimization in the indirect adaptation case may be expressed as $$E(x) = \rho |x|^2 + \frac{1}{N} \sum_{t \in T} \left| e[t] - \sum_k x_k B_k(q_y[t]) \right|^2,$$

where e[t]=v[t]−y[t]. This can be expressed in vector/matrix form as $$E(x) = \rho |x|^2 + \frac{1}{N} \sum_{t \in T} |e[t] - a[t] x|^2$$

where $$a[t] = [B_1(q_y[t]), B_2(q_y[t]), \ldots, B_n(q_y[t])].$$

Using the form, following matrices can be computed:

$$G = \frac{1}{N} \sum_{t \in T} a[t]' a[t],$$

$$L = \frac{1}{N} \sum_{t \in T} a[t]' e[t],$$

and $$R = \frac{1}{N} \sum_{t \in T} |e[t]|^2.$$

From these, one approach to updating the parameters x is by a solution $$x \leftarrow (\rho I_n + G)^{-1} L$$

where $I_n$ denotes an n×n identity.

In some examples, the Gramian, G, and related terms above, are accumulated over a sampling interval T, and then the matrix inverse is computed. In some examples, the terms are updated in a continual decaying average using a "memory Gramian" approach. In some such examples, rather than computing the inverse at each step, a coordinate descent procedure is used in which at each iteration, only one of the components of x is updated, thereby avoiding the need to perform a full matrix inverse, which may not be computationally feasible in some applications.

As an alternative to the solution above, a stochastic gradient approach may be used implementing:

$$x \leftarrow x - \zeta(a[t]'(a[t] x - e[t]) + \rho x)$$

where ζ is a step size that is selected adaptively. For example, one or more samples of the signals are selected a fixed or random intervals to update the parameters or a buffer of past pairs $q_y[t], v[t]$ is maintained, for example, by periodic updating, and random samples from the buffer are selected to update the parameter values using the gradient update equation above.

Yet other adaptation procedures that may be used in conjunction with the approaches presented in this document are described in co-pending U.S. application Ser. No. 16/004,594, titled "Linearization System," filed on Jun. 11, 2018, which is incorporated herein by reference.

Returning to the selection of the particular s to be used for a device to be linearized, which are represented in the fixed parameters z, which includes the selection of the particular $w_k$ terms to generate, and then the particular $r_p$ to generate from the $w_k$, and then the particular subset of $r_p$ to use to weight each of the $w_k$ in the sum yielding the distortion term, uses a systematic methodology. One such methodology is performed when a new device (a "device under test", DUT) is evaluated for linearization. For this evaluation, recorded data sequences (u[.], y[.]) and/or (v[.], y[.]) are collected. A predistorter structure that includes a large number of terms, possibly an exhaustive set of terms within a constrain on delays, number of $w_k$ and $r_p$ terms etc. is constructed. The least mean squared (LMS) criterion discussed above is used to determine the values of the exhaustive set of parameters x. Then, a variable selection procedure is used and this set of parameters is reduced, essentially, by omitting terms that have relatively little impact on the distortion term $\delta[.]$. One way to make this selection uses the LASSO (least absolute shrinkage and selection operator) technique, which is a regression analysis method that performs both variable selection and regularization, to determine which terms to retain for use in the runtime system. In some implementations, the runtime system is configured with the parameter values x determined at this stage. Note that it should be understood that there are some uses of the techniques described above that omit the adapter completely (i.e., the adapter is a non-essential part of the system), and the parameters are set one (e.g., at manufacturing time), and not adapted during operation, or may be updated from time to time using an offline parameter estimation procedure.

An example of applying the techniques described above starts with the general description of the distortion term $$\delta[t] = \sum_k w_{a_k}[t-d_k] \sum_j \phi_{k,j}(r_j[t]).$$

The complex signals derived from the input, and the real signals derived from the complex signals are chosen do that the fill distortion term has the following full form:

$$\delta[t] = \sum_{k=-5}^{+5} u[t-k] \sum_{j=-5}^{+5} \phi_{1,k,j}(|u[t-k-j]|) +$$

$$\sum_{l=-5}^{+5} \sum_{d=0}^{1} \frac{(u[t-l]+j^d u[t-l-1])}{2} \phi_{2,l,d}\left(\frac{|u[t-l]+u[t-l-1]|}{2}\right) +$$

$$\sum_{m=-5}^{+5} \sum_{n=-2}^{+2} u[t-m] \phi_{3,m,n}(|u[t-m]||u[t-m-n]|)$$

This form creates a total of 198 (=121+22+55) terms. In an experimental example, this set of terms is reduced from 198 terms to 6 terms using a LASSO procedure. These remaining 6 terms result in the distortion term having the form:

$$\delta[t] = u[t]\phi_{1,0,0}(|u[t]|) + u[t-1]\phi_{1,1,0}(|u[t-1]|) +$$

$$\frac{(u[t-4]+ju[t-5])}{2}\phi_{2,4,1}\left(\frac{|u[t-4]+u[t-5]|}{2}\right) +$$

$$\frac{(u[t+2]+u[t+1])}{2}\phi_{2,-2,0}\left(\frac{|u[t+2]+u[t+1]|}{2}\right) +$$

$$u[t-5]\phi_{3,5,2}(|u[t-5]||u[t-7]|) + u[t+5]\phi_{3,-5,-2}(|u[t+5]||u[t+7]|)$$

This form is computationally efficient because only 6 $w_k$ complex signals and 6 real signals $r_p$ terms that must be computed at each time step. If each non-linear transformation is represented by 32 linear segments, then the lookup tables have a total of 6 times 33, or 198 complex values. If each non-linear function is represented by 32 piecewise segments defined by 6 kernels, then there are only 36 complex parameter values that need to be adapted (i.e., 6 scale factors for the kernels of each non-linear function, and 6 such non-linear functions).

The techniques described above may be applied in a wide range of radio-frequency communication systems. For example, approach illustrated in FIG. 1 may be used for wide area (e.g., cellular) base stations to linearize transmission of one or more channels in a system adhering to standard, such as 3GPP or IEEE standards (implemented over licensed and unlicensed frequency bands), pre-5G and 5G New Radio (NR), etc. Similarly, the approach can be implemented in a mobile station (e.g., a smartphone, handset, mobile client device (e.g., a vehicle), fixed client device, etc.). Furthermore, the techniques are equally applicable to local area communication (e.g., "Wifi", the family of 802.11 protocols, etc.) as they are to wide area communication. Furthermore, the approaches can be applied to wired rather than wireless communication, for example, to linearize transmitters in coaxial network distribution, for instance to linearize amplification and transmission stages for DOCSIS (Data Over Cable Service Interface Specification) head ends system and client modems. Yet other applications are not necessarily related to electrical signals, and the techniques may be used to linearize mechanical or acoustic actuators (e.g., audio speakers), and optical transmission systems. Finally, although described above in the context of linearizing a transmission path, with a suitable reference signal representing a transmission (e.g. predefine pilot signal patterns) the approach may be used to linearize a receiver, or to linearize a combined transmitter-channel-receiver path.

A summary of a typical use case of the approaches described above is as follows. First, initial data sequences (u[.], y[.]) and/or (v[.], y[.]), as well as corresponding sequences e[.] and p[.] in implementations that make use of these optional inputs, are obtained for a new type of device, for example, for a new cellular base station or a smartphone handset. Using this data, a set of complex signals $w_k$ and real signals $r_p$ are selected for the runtime system, for example, based on an ad hoc selection approach, or an optimization such as using the LASSO approach. In this selection stage, computational constraints for the runtime system are taken into account so that the computational limitations are not exceeded and/or performance requirements are met. Such computational requirements may be expressed, for example, in terms computational operations per second, storage requirements, and/or for hardware implementations in terms of circuit area or power requirements. Note that there may be separate limits on the computational constraints for the predistorter 130, which operates on every input value, and on the adapter, which may operate only from time to time to update the parameters of the system. Having determined the terms to be used in the runtime system, a specification of that system is produced. In some implementations, that specification includes code that will execute on a processor, for example, an embedded processor for the system. In some implementations, the specification includes a design structure that specifies a hardware implementation of the predistorter and/or the adapter. For example, the design structure may include configuration data for a field-programmable gate array (FPGA), or may include a hardware description language specification of an application-specific integrated circuit (ASIC). In such hardware implementations, the hardware device includes input and output ports for the inputs and outputs shown in FIG. 1 for the predistorter and the adapter. In some examples, the memory for the predistorter is external to the device, while in other examples, it is integrated into the device. In some examples, the adapter is implemented in a separate device than the predistorter, in which case the predistorter may have a port for receiving updated values of the adaption parameters.

In some implementations, a computer accessible non-transitory storage medium includes instructions for causing a digital processor to execute instructions implementing procedures described above. The digital processor may be a general-purpose processor, a special purpose processor, such as an embedded processor or a controller, and may be a processor core integrated in a hardware device that implements at least some of the functions in dedicated circuitry (e.g., with dedicated arithmetic units, storage registers, etc.). In some implementations, a computer accessible non-transitory storage medium includes a database representative of a system including some or all of the components of the linearization system. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

It is to be understood that the foregoing description is intended to illustrate and not to limit the scope of the invention, which is defined by the scope of the appended claims. Reference signs, including drawing reference numerals and/or algebraic symbols, in parentheses in the claims should not be seen as limiting the extent of the matter protected by the claims; their sole function is to make claims easier to understand by providing a connection between the features mentioned in the claims and one or more embodiments disclosed in the Description and Drawings. Other embodiments are within the scope of the following claims.

What is claimed is:

1. A method of signal predistortion for linearizing a non-linear circuit, the method comprising:
processing an input signal (u) to produce a plurality of transformed signals (w);
determining a plurality of phase-invariant derived signals (r), each derived signal ($r_j$) of the plurality of derived signals being equal to a respective non-linear function of one or more of the transformed signals, at least some of the derived signals being equal to respective functions of different one or more of the transformed signals;
transforming each derived signal ($r_j$) of the plurality of phase-invariant derived signals according to a parametric non-linear transformation to produce a time-varying gain component ($g_i$) of a plurality of gain components (g);
forming a distortion term by accumulating a plurality of terms, each term being a product of a respective transformed signal of the plurality of transformed signals and a respective time-varying gain, the time-varying gain being a function ($\Phi$) of a one or more of the phase-invariant derived signals, the function of the one or more of the phase-invariant derived signals being decomposable into a combination of one or more parametric functions ($\phi$) of a corresponding single one of the phase invariant derived signals ($r_j$) yielding a corresponding one of the time-varying gain components ($g_i$); and
providing an output signal (v) determined from the distortion term for application to the non-linear circuit.

2. The method of claim 1 where the non-linear circuit comprises a radio-frequency section including a radio-frequency modulator configured to modulate the output signal to a carrier frequency to form a modulated signal and an amplifier for amplifying the modulated signal.

3. The method of claim 1 wherein processing the input signal (u) to produce the plurality of transformed signals (w) includes forming at least one of the transformed signals as a linear combination of the input signal (u) and one or more delayed versions of the input signal.

4. The method of claim 3 wherein forming at least one of the transformed signals as a linear combination includes forming a linear combination with at least one imaginary or complex multiple input signal or a delayed version of the input signal.

5. The method of claim 4 wherein forming at least one of the transformed signals, $w_k$ to be a multiple of $D_\alpha w_a + j^d w_b$, where $w_a$ and $w_b$ are other of the transformed signals, and $D_\alpha$ represents a delay by $\alpha$, and d is an integer between 0 and 3.

6. The method of claim 5 wherein forming the at least one of the transformed signals includes time filtering the input signal to form said transformed signal.

7. The method of claim 1 wherein determining a plurality of phase-invariant derived signals (r) comprises determining real-valued derived signals including processing the transformed signals (w) to produce a plurality of phase-invariant derived signals (r).

8. The method of claim 7 wherein processing the transformed signals (w) to produce a plurality of phase-invariant derived signals includes for at least one derived signal ($r_p$) computing said derived signal by first computing a phase-invariant non-linear function of one of the transformed signals ($w_k$) to produce a first derived signal, and then computing a linear combination of the first derived signal and delayed versions of the first derived signal to determine the at least one derived signal.

9. The method of claim 8 wherein computing the linear combination of the first derived signal and delayed versions of the first derived signal comprises time filtering the first derived signal.

10. The method of claim 7 wherein processing the transformed signals (w) to produce a plurality of phase-invariant derived signals includes computing a first signal as a phase-invariant non-linear function of a first signal of the transformed signals, and computing a second signal as a phase-invariant non-linear function of a second of the transformed signals, and then computing a combination of the first signal and the second signal to form at least one of the phase-invariant derived signals.

11. The method of claim 7 wherein processing the transformed signals (w) to produce a plurality of phase-invariant derived signals includes computing a derived signal $r_k[t]$ using at least one of the following transformations:

$$r_k[t]=|w_a[t]|^\alpha,$$

where $\alpha>0$ for a transformed signal $w_a[t]$;

$$r_k[t]=0.5(1-\theta+r_a[t-\alpha]+\theta r_b[t]),$$

where $\theta \in \{1,-1\}$, $a,b \in \{1, \ldots, k-1\}$, and $\alpha$ is an integer and $r_a[t]$ and $r_b[t]$ are other of the derived signals;

$$r_k[t]=r_a[t-\alpha]r_b[t],$$

where $a,b \in \{1, \ldots, k-1\}$ and $\alpha$ is an integer and $r_a[t]$ and $r_b[t]$ are other of the derived signals; and $$r_k[t]=r_k[t-1]+2^{-d}(r_a[t]-r_k[t-1]),$$

where $a \in \{1, \ldots, k-1\}$ and d is an integer $d>0$.

12. The method of claim 1 further comprising transforming a first derived signal ($r_j$) of the plurality of phase-invariant derived signals according to one or more different parametric non-linear transformation to produce a corresponding time-varying gain components.

13. The method of claim 12 wherein the one or more different parametric non-linear transformations comprises multiple different non-linear transformations producing corresponding time-varying gain components.

14. The method of claim 13 wherein each of the corresponding time-varying gain components forms a part of a different term of the plurality of terms of the distortion term.

15. The method of claim 1 wherein forming the distortion term comprises forming a first sum of products, each term in the first sum being a product of a delayed version of the transformed signal and a second sum of a corresponding subset of the gain components.

16. The method of claim 15 wherein the distortion term $\delta[t]$ has a form $$\delta[t] = \sum_k w_{a_k}[t-d_k] \sum_{i \in \Lambda_k} g_i[t]$$

wherein for each term indexed by k, $a_k$ selects the transformed signal, $d_k$ determines the delay of said transformed signal, and $\Lambda_k$ determines the subset of the gain components.

17. The method of claim 1 wherein transforming a first derived signal of the plurality of derived signals according to a parametric non-linear transformation comprises performing a table lookup in a data table corresponding to said transformation according to the first derived signal to determine a result of the transforming.

18. The method of claim 17 wherein the parametric non-linear transformation comprises a plurality of segments, each segment corresponding to a different range of values of the first derived signal, and wherein transforming the first derived signal according to the parametric non-linear transformation comprises determining a segment of the parametric non-linear transformation from the first derived signal and accessing data from the data table corresponding to a said segment.

19. The method of claim 18 wherein the parametric non-linear transformation comprises a piecewise linear or a piecewise constant transformation, and the data from the data table corresponding to said segment characterizes end-points of said segment.

20. The method of claim 19 wherein the non-linear transformation comprises a piecewise linear transformation, and transforming the first derived signal comprises interpolating a value on a linear segment of said transformation.

21. The method of claim 1 further comprising adapting configuration parameters of the parametric non-linear transformation according to sensed output of the non-linear circuit.

22. The method of claim 21 further comprising acquiring a sensing signal (y) dependent on an output of the non-linear circuit, and wherein adapting the configuration parameters includes adjusting said parameters according to a relationship of the sensing signal (y) and at least one of the input signal (u) and the output signal (v).

23. The method of claim 22 wherein adjusting said parameters includes reducing a mean squared value of a signal computed from the sensing signal (y) and at least one of the input signal (u) and the output signal (v) according to said parameters.

24. The method of claim 23 wherein reducing the mean squared value includes applying a stochastic gradient procedure to incrementally update the configuration parameters.

25. The method of claim 23 wherein reducing the mean squared value includes processing a time interval of the sensing signal (y) and a corresponding time interval of at least one of the input signal (u) and the output signal (v).

26. The method of claim 25 comprising performing a matrix inverse of a Gramian matrix determined from the time interval of the sensing signal and a corresponding time interval of at least one of the input signal (u) and the output signal (v).

27. The method of claim 26 further comprising forming the Gramian matrix as a time average Gramian.

28. The method of claim 21 wherein transforming a first derived signal of the plurality of derived signals according to a parametric non-linear transformation comprises performing a table lookup in a data table corresponding to said transformation according to the first derived signal to determine a result of the transforming, and wherein adapting the configuration parameters comprises updating values in the data table.

29. The method of claim 28 wherein the parametric non-linear transformation comprises a greater number of piecewise linear segments than adjustable parameters characterizing said transformation.

30. The method of claim 29 wherein the non-linear transformation represents a function that is a sum of scaled kernels, a magnitude scaling each kernel being determined by a different one of the adjustable parameters characterizing said transformation.

31. The method of claim 30 wherein each kernel comprises a piecewise linear function.

32. The method of claim 30 wherein each kernel is zero for at least some range of values of the derived signal.

33. The method of claim 1 wherein the non-linear functions of the input signal (u) comprises at least one function of a form $$u[n-\tau]|u[n-\tau]|^p$$

for a delay $\tau$ and an integer power p or $$\Pi_{j=1 \ldots p} u[n-\tau_j] \Pi_{j=p+1 \ldots 2p-1} u[n-\tau_j]^*$$

for a set for integer delays $\tau_1$ to $\Sigma_{2p-1}$, where * indicates a complex conjugate operation.

34. A method of signal predistortion for linearizing a non-linear circuit comprising a radio-frequency section including a radio-frequency modulator configured to modulate an output signal to a carrier frequency to form a modulated signal and an amplifier for amplifying the modulated signal, the method comprising:

processing an input signal (u) to produce a plurality of transformed signals (w), the input signal (u) comprising quadrature components of a baseband signal for transmission via the radio-frequency section, and the plurality of transformed signals (w) comprising complex-valued signals;

determining a plurality of phase-invariant real-valued derived signals (r), each derived signal ($r_j$) of the plurality of derived signals being equal to a respective non-linear function of one or more of the transformed signals, at least some of the derived signals being equal to respective functions of different one or more of the transformed signals;

transforming each derived signal ($r_j$) of the plurality of phase-invariant derived signals according to a parametric non-linear transformation to produce a time-varying gain component ($g_i$) of a plurality of gain components (g), including transforming a first derived signal ($r_j$) of the plurality of phase-invariant derived signals according to one or more different parametric non-linear transformation to produce corresponding time-varying gain components, wherein transforming the first derived signal of the plurality of derived signals according to a parametric non-linear transformation comprises performing a table lookup in a data table corresponding to said transformation according to the first derived signal to determine a result of the transforming, and wherein the parametric non-linear transformation comprises a piecewise linear transformation, and the data from the data table corresponding to said segment characterizes endpoints of said segment and transforming the first derived signal comprises interpolating a value on a linear segment of said transformation;

forming a distortion term by accumulating a plurality of terms, each term being a product of a transformed signal of the plurality of transformed signals and a time-varying gain, the time-varying gain being a function ($\Phi$) of a one or more of the phase-invariant derived signals, the function of the one or more of the phase-invariant derived signals being decomposable into a combination of one or more parametric functions ($\phi$) of a corresponding single one of the phase invariant derived signals ($r_j$) yielding a corresponding one of the time-varying gain components ($g_i$);

providing an output signal (v) determined from the distortion term for application to the non-linear circuit; and adapting configuration parameters of the parametric non-linear transformation according to sensed output of the non-linear circuit, including updating values in the data table.

35. A digital predistorter circuit comprising:
an input port for receiving an input signal (u);
an output port for providing an output signal (v);
storage for values of a plurality of configuration parameters (x);
wherein the circuit is configured to perform operations comprising:
receiving the input signal (u) via the input port;
processing the input signal (u) to produce a plurality of transformed signals (w);
determining a plurality of phase-invariant derived signals (r), each derived signal ($r_j$) of the plurality of derived signals being equal to a respective non-linear function of one or more of the transformed signals, at least some of the derived signals being equal to respective functions of different one or more of the transformed signals;
transforming each derived signal ($r_j$) of the plurality of phase-invariant derived signals according to a parametric non-linear transformation to produce a time-varying gain component ($g_i$) of a plurality of gain components (g);
forming a distortion term by accumulating a plurality of terms, each term being a product of a transformed signal of the plurality of transformed signals and a time-varying gain, the time-varying gain being a function ($\Phi$) of a one or more of the phase-invariant derived signals, the function of the one or more of the phase-invariant derived signals being decomposable into a combination of one or more parametric functions ($\phi$) of a corresponding single one of the phase invariant derived signals ($r_j$) yielding a corresponding one of the time-varying gain components ($g_i$); and
providing the output signal (v) determined from the distortion term via the output port.

36. A non-transitory machine-readable medium comprising a design structure, said design structure comprising elements that, when processed in a computer-aided design system, generates a machine-executable representation of the digital predistortion circuit of claim 35.

* * * * *